(12) United States Patent
Wang

(10) Patent No.: US 12,395,382 B2
(45) Date of Patent: Aug. 19, 2025

(54) FREQUENCY-DETECTING CIRCUIT AND ELECTRONIC DEVICE

(71) Applicant: GigaDevice Semiconductor Inc., Beijing (CN)

(72) Inventor: Menghai Wang, Beijing (CN)

(73) Assignee: GigaDevice Semiconductor Inc., Beijing (CN)

( * ) Notice: Subject to any disclaimer, the term of this patent is extended or adjusted under 35 U.S.C. 154(b) by 233 days.

(21) Appl. No.: 18/144,865

(22) Filed: May 9, 2023

(65) Prior Publication Data
US 2024/0106684 A1    Mar. 28, 2024

(30) Foreign Application Priority Data
Sep. 26, 2022    (CN) .......................... 202211176423.X

(51) Int. Cl.
*H04L 25/02*    (2006.01)
*H04L 7/00*    (2006.01)

(52) U.S. Cl.
CPC ........ *H04L 25/0262* (2013.01); *H04L 7/0037* (2013.01)

(58) Field of Classification Search
None
See application file for complete search history.

(56) References Cited

U.S. PATENT DOCUMENTS

| | | | | |
|---|---|---|---|---|
| 3,691,305 A | * | 9/1972 | Huebner | H04J 3/047 370/241 |
| 3,708,686 A | * | 1/1973 | Butler, Jr. | G06F 1/08 331/49 |
| 3,941,920 A | * | 3/1976 | Mohri | H04N 7/54 348/24 |
| 4,912,419 A | * | 3/1990 | Young | G01R 23/10 377/41 |
| 5,157,510 A | * | 10/1992 | Quan | H04N 5/913 386/314 |

(Continued)

FOREIGN PATENT DOCUMENTS

| | | | | |
|---|---|---|---|---|
| CA | 2882321 A1 | * | 6/2013 | ......... H04L 25/4902 |
| CA | 2882321 C | * | 5/2018 | ......... H04L 25/4902 |

(Continued)

*Primary Examiner* — Berhanu Tadese

(57) ABSTRACT

A frequency-detecting circuit and an electronic device are provided. The frequency-detecting circuit includes a pulse-narrowing circuit and a judging-and-sampling circuit coupled to the pulse-narrowing circuit. The pulse-narrowing circuit is configured to receive a to-be-detected clock signal, and perform at least one pulse-narrowing process for the to-be-detected clock signal. The pulse-narrowing circuit has at least one detection-point frequency, and the pulse-narrowing circuit is configured to narrow the to-be-detected clock signal based on the detection-point frequency to obtain a narrowed output clock signal. The judging-and-sampling circuit is configured to sample the narrowed output clock signal by employing the to-be-detected clock signal as a sampling clock signal to obtain a frequency indication signal. The frequency indication signal is configured to indicate whether the to-be-detected clock signal is greater than the detection-point frequency.

20 Claims, 7 Drawing Sheets

(56) References Cited

U.S. PATENT DOCUMENTS

| | | | | |
|---|---|---|---|---|
| 5,194,965 | A * | 3/1993 | Quan | G11B 20/00086 386/314 |
| 5,736,872 | A * | 4/1998 | Sharma | H03D 13/004 327/12 |
| 6,272,439 | B1 * | 8/2001 | Buer | G01R 23/175 327/158 |
| 6,285,219 | B1 * | 9/2001 | Pauls | H03D 13/004 327/12 |
| 6,316,918 | B1 * | 11/2001 | Underwood | H02J 3/40 322/20 |
| 6,351,508 | B1 * | 2/2002 | Shishkoff | H04J 3/0626 375/375 |
| 6,445,737 | B1 * | 9/2002 | Walker | H04L 25/4902 332/112 |
| 6,738,922 | B1 * | 5/2004 | Warwar | H04L 7/033 713/503 |
| 6,873,274 | B2 * | 3/2005 | Oki | H03M 3/50 341/118 |
| 6,958,639 | B2 * | 10/2005 | Park | H03K 5/1565 327/175 |
| 7,215,207 | B2 * | 5/2007 | Hsieh | H03L 7/113 331/25 |
| 7,285,994 | B2 * | 10/2007 | Dalton | H03L 7/087 327/12 |
| RE40,689 | E * | 3/2009 | Quan | G11B 20/00688 380/204 |
| 7,610,023 | B2 * | 10/2009 | Douglas | H03L 7/10 455/87 |
| 7,616,034 | B2 * | 11/2009 | Lee | H03K 5/135 327/144 |
| 7,746,128 | B2 * | 6/2010 | Kim | H03L 7/0812 327/170 |
| 7,786,763 | B1 * | 8/2010 | Bal | H03D 13/00 327/43 |
| 7,932,751 | B2 * | 4/2011 | Boomer | H03K 5/26 327/47 |
| 8,369,807 | B2 * | 2/2013 | Mikhemar | H04B 1/38 375/322 |
| 8,483,628 | B2 * | 7/2013 | Mirzaei | H03H 7/38 455/313 |
| 8,736,329 | B1 * | 5/2014 | Rajavi | H03K 5/1565 327/175 |
| 8,878,792 | B2 * | 11/2014 | Lim | H03L 7/0816 345/173 |
| 8,970,254 | B1 * | 3/2015 | Murphy | H04L 25/4902 327/39 |
| 9,031,515 | B2 * | 5/2015 | Mikhemar | H04B 1/006 333/204 |
| 9,088,286 | B2 * | 7/2015 | Park | H03K 5/19 |
| 9,344,075 | B2 * | 5/2016 | Abuhamdeh | G01R 31/31725 |
| 9,424,849 | B2 * | 8/2016 | Lesso | H04L 25/4902 |
| 9,768,760 | B2 * | 9/2017 | Takahashi | H03K 5/06 |
| 10,404,247 | B2 * | 9/2019 | Minzoni | H03K 7/08 |
| 10,461,921 | B2 * | 10/2019 | Bai | H03L 7/087 |
| 10,491,368 | B2 * | 11/2019 | Bai | H03K 19/21 |
| 10,511,432 | B2 * | 12/2019 | Bai | H04L 7/0037 |
| 10,523,412 | B2 * | 12/2019 | Bai | H04L 7/033 |
| 10,523,413 | B2 * | 12/2019 | Bai | H04L 25/4902 |
| 10,523,414 | B2 * | 12/2019 | Bai | H03L 7/0807 |
| 10,636,431 | B2 * | 4/2020 | Lesso | G10L 19/002 |
| 10,841,072 | B2 * | 11/2020 | Huang | H04L 7/048 |
| 11,095,291 | B2 * | 8/2021 | Tripodi | G04F 10/00 |
| 11,417,349 | B2 * | 8/2022 | Lesso | H04L 25/49 |
| 11,424,746 | B1 * | 8/2022 | Chuang | H03L 7/0807 |
| 11,632,114 | B2 * | 4/2023 | Tajalli | H04L 25/0272 375/327 |
| 11,728,961 | B2 * | 8/2023 | Lee | H03L 7/23 375/362 |
| 11,791,811 | B2 * | 10/2023 | Rie | H03K 3/017 327/295 |
| 11,804,845 | B2 * | 10/2023 | Tajalli | H03L 7/0896 |
| 12,002,482 | B2 * | 6/2024 | Lesso | G10L 19/002 |
| 12,055,571 | B2 * | 8/2024 | Liu | H03K 3/037 |
| 2001/0048290 | A1 * | 12/2001 | Underwood | H02J 3/38 322/20 |
| 2002/0030365 | A1 * | 3/2002 | Underwood | H02J 3/40 290/40 B |
| 2002/0097682 | A1 * | 7/2002 | Enam | H03L 7/091 398/9 |
| 2002/0110190 | A1 * | 8/2002 | Walker | H04L 25/4902 375/239 |
| 2002/0118006 | A1 * | 8/2002 | Enam | H03D 7/1441 324/76.53 |
| 2002/0118043 | A1 * | 8/2002 | Enam | H03L 7/099 326/89 |
| 2002/0118704 | A1 * | 8/2002 | Enam | H03K 19/01812 370/518 |
| 2002/0122438 | A1 * | 9/2002 | Enam | H03L 7/0896 370/518 |
| 2002/0122443 | A1 * | 9/2002 | Enam | H03L 7/10 370/537 |
| 2002/0124030 | A1 * | 9/2002 | Enam | H03L 7/091 708/102 |
| 2002/0135403 | A1 * | 9/2002 | Enam | H03L 7/091 327/100 |
| 2002/0136340 | A1 * | 9/2002 | Enam | H04L 25/0294 375/373 |
| 2002/0138540 | A1 * | 9/2002 | Enam | H03L 7/0896 708/835 |
| 2002/0140439 | A1 * | 10/2002 | Enam | H04L 25/028 324/678 |
| 2002/0140461 | A1 * | 10/2002 | Enam | H03L 7/099 327/65 |
| 2002/0141515 | A1 * | 10/2002 | Enam | H04L 25/0292 375/340 |
| 2002/0196887 | A1 * | 12/2002 | Heikkila | H03L 7/0816 375/371 |
| 2003/0123571 | A1 * | 7/2003 | Scheffler | H04L 7/0037 375/316 |
| 2004/0217894 | A1 * | 11/2004 | Cho | H03M 1/48 341/157 |
| 2005/0024094 | A1 * | 2/2005 | Dalton | H03L 7/087 327/47 |
| 2005/0058235 | A1 * | 3/2005 | Beeson | H03L 7/087 375/376 |
| 2006/0250192 | A1 * | 11/2006 | Hsieh | H03L 7/113 331/16 |
| 2008/0008283 | A1 * | 1/2008 | Lee | H04L 25/02 375/375 |
| 2016/0118962 | A1 * | 4/2016 | Tseng | H03K 5/1565 327/115 |
| 2021/0126643 | A1 * | 4/2021 | Tripodi | G06F 1/08 |
| 2022/0247414 | A1 * | 8/2022 | Chuang | H03L 7/091 |
| 2022/0368513 | A1 * | 11/2022 | Lee | H03L 7/0816 |
| 2023/0387890 | A1 * | 11/2023 | Wang | H03K 19/20 |
| 2024/0106684 | A1 * | 3/2024 | Wang | H03K 5/26 |

FOREIGN PATENT DOCUMENTS

| | | | | |
|---|---|---|---|---|
| CA | 2387129 | A1 * | 6/2021 | H03L 7/085 |
| CN | 1290443 | A * | 4/2001 | H04L 7/027 |
| CN | 1134948 | C * | 1/2004 | H04L 7/027 |
| CN | 1938951 | A * | 3/2007 | H03L 7/0898 |
| CN | 101145898 | A * | 3/2008 | H03L 7/08 |
| CN | 100456039 | C * | 1/2009 | H03L 7/085 |
| CN | 104113303 | * | 2/2014 | |
| CN | 104113303 | A * | 10/2014 | |
| CN | 104793558 | A * | 7/2015 | H03K 5/26 |
| CN | 106063207 | A * | 10/2016 | H04L 25/4902 |
| CN | 104113303 | B * | 2/2017 | |
| CN | 106063207 | B * | 1/2018 | H04L 25/4902 |
| CN | 108352838 | A * | 7/2018 | H04L 7/0008 |
| CN | 111122971 | A * | 5/2020 | H03H 11/04 |
| CN | 113364434 | A * | 9/2021 | H03K 5/156 |
| CN | 113795773 | A * | 12/2021 | B60W 60/00 |
| CN | 111122971 | B * | 7/2023 | G01R 23/10 |
| CN | 117169589 | A * | 12/2023 | |
| CN | 117174133 | A * | 12/2023 | |
| CN | 113364434 | B * | 3/2024 | H03K 5/156 |

(56) References Cited

FOREIGN PATENT DOCUMENTS

| | | | | | |
|---|---|---|---|---|---|
| CN | 114826539 | B | * | 4/2024 | ........... H04L 7/0079 |
| CN | 117805478 | A | * | 4/2024 | .............. H03K 5/26 |
| DE | 102006041962 | A1 | * | 4/2007 | .............. H03K 5/00 |
| DE | 102006041962 | B4 | * | 7/2019 | .............. H03K 5/00 |
| DE | 102021205187 | A1 | * | 11/2022 | ............ H04L 27/10 |
| EP | 0665650 | A1 | * | 8/1995 | ............ H03L 7/089 |
| EP | 1126615 | A1 | * | 8/2001 | ......... H03K 23/665 |
| EP | 1195903 | A2 | * | 4/2002 | .............. H03L 7/14 |
| EP | 3114805 | B1 | * | 9/2017 | ........ H04L 25/4902 |
| FR | 2760306 | A1 | * | 9/1998 | .............. H04N 5/44 |
| FR | 2775860 | A1 | * | 9/1999 | ........ H04N 7/17309 |
| FR | 2810476 | A1 | * | 12/2001 | .............. H04N 5/44 |
| FR | 2838000 | A1 | * | 10/2003 | ........ H04N 21/4222 |
| FR | 2863807 | A1 | * | 6/2005 | ............ G07B 15/02 |
| GB | 1381338 | A | * | 1/1975 | ........ H04L 25/4904 |
| GB | 2068666 | A | * | 8/1981 | .............. H04N 9/64 |
| GB | 2497566 | A | * | 6/2013 | .......... H04B 14/026 |
| GB | 2497605 | A | * | 6/2013 | ........ H04L 25/4902 |
| GB | 2497606 | A | * | 6/2013 | .......... H04B 14/026 |
| GB | 2499699 | A | * | 8/2013 | ............ H04L 25/49 |
| GB | 2561477 | A | * | 10/2018 | .......... H04B 14/026 |
| GB | 2561478 | A | * | 10/2018 | .......... H04B 14/026 |
| JP | H07264059 | A | * | 10/1995 | ........ H03D 13/004 |
| JP | 2727256 | B2 | * | 3/1998 | ....... G11B 20/10009 |
| JP | H1188157 | A | * | 3/1999 | ............. H03L 7/085 |
| JP | H11167728 | A | * | 6/1999 | |
| JP | 2000183731 | A | * | 6/2000 | |
| JP | 2004205339 | A | * | 7/2004 | ............. G01R 23/15 |
| JP | 2008054305 | A | * | 3/2008 | ............ H03L 7/0812 |
| JP | 4091027 | B2 | * | 5/2008 | ............ H04B 10/505 |
| KR | 20140093871 | A | * | 7/2014 | ......... G11C 11/4076 |
| KR | 101823789 | B1 | * | 1/2018 | ............ H03L 7/0891 |
| KR | 20180060100 | A | * | 6/2018 | ............ H03L 7/0816 |
| KR | 20200048498 | A | * | 5/2020 | ............. H03H 11/04 |
| KR | 20220154482 | A | * | 11/2022 | .............. H03K 5/19 |
| TW | 395130 | B | * | 6/2000 | |
| TW | 1468000 | B | * | 1/2015 | ............ H03L 7/0805 |
| TW | 202110098 | A | * | 3/2021 | ............. H03L 7/093 |
| WO | WO-0004639 | A1 | * | 1/2000 | .............. H03K 5/26 |
| WO | WO-0013285 | A2 | * | 3/2000 | ................ H02J 3/38 |
| WO | WO-0145309 | A2 | * | 6/2001 | ............. H03L 7/085 |
| WO | WO-0195552 | A2 | * | 12/2001 | ........... H03D 7/1433 |
| WO | WO-0197511 | A1 | * | 12/2001 | ............... H04N 5/38 |
| WO | WO-02065640 | A1 | * | 8/2002 | ........... H04L 25/4902 |
| WO | WO-2005029709 | A2 | * | 3/2005 | ............. H03L 7/087 |
| WO | WO-2013088173 | A1 | * | 6/2013 | ............ H04L 25/49 |
| WO | WO-2013088174 | A1 | * | 6/2013 | .......... H04B 14/026 |
| WO | WO-2014123802 | A2 | * | 8/2014 | ................ G06F 1/04 |
| WO | WO-2015134189 | A1 | * | 9/2015 | ........ H04L 25/0262 |

\* cited by examiner

FREQUENCY-DETECTING CIRCUIT AND ELECTRONIC DEVICE

CROSS REFERENCE

The present application claims priorities and rights to Chinese Patent Application No. 202211176423.X, filed on Sep. 26, 2022, the entire content of which is hereby incorporated by reference in its entirety.

TECHNICAL FIELD

The present disclosure relates to the field of circuit technologies, and in particular to a frequency-detecting circuit and an electronic device.

BACKGROUND

A clock signal is usually used in electronic devices. The clock signal is generally used in synchronization circuits as a timer, ensuring relevant electronic components operate synchronously. In some application scenarios, a frequency of the clock signal is required to be detected. In general, a more complex circuit needs to be designed for a specific value of the frequency of the clock signal being accurately detected.

However, in other application scenarios, it is enough to detect a change of the frequency of the clock signal, and the specific value of the frequency is not required to be detected. A change of the clock signal is required to be detected in real time, so as to determine a range in which the clock signal is.

SUMMARY OF THE DISCLOSURE

The present disclosure provides a frequency-detecting circuit and an electronic device, which are capable of performing a frequency detection for a clock signal.

A frequency-detecting circuit is provided. The frequency-detecting circuit comprises a pulse-narrowing circuit, configured to receive a to-be-detected clock signal, perform at least one pulse-narrowing process for the to-be-detected clock signal, wherein the pulse-narrowing circuit has at least one detection-point frequency, and the pulse-narrowing circuit is configured to narrow the to-be-detected clock signal based on the detection-point frequency to obtain a narrowed output clock signal; and a judging-and-sampling circuit, coupled to the pulse-narrowing circuit, and configured to sample the narrowed output clock signal by employing the to-be-detected clock signal as a sampling clock signal to obtain a frequency indication signal, wherein the frequency indication signal is configured to indicate whether the to-be-detected clock signal is greater than the detection-point frequency.

An electronic device is provided, and comprises the above frequency-detecting circuit.

BRIEF DESCRIPTION OF THE DRAWINGS

In order to more clearly illustrate the technical solutions in the embodiments of the present disclosure, a brief description of the accompanying drawings to be used in the description of the embodiments will be given below. It will be obvious that the accompanying drawings in the following description are only some embodiments of the present disclosure, and that other accompanying drawings may be obtained on the basis of these drawings without any creative effort for those skilled in the art.

DETAILED DESCRIPTION

The technical solutions in the embodiments of the present disclosure will be clearly and completely described below with reference to accompanying drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts shall fall within the scope of the present disclosure.

Figure 1:
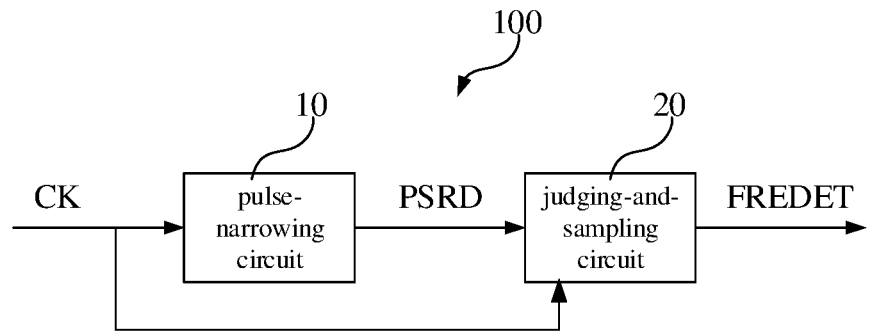
FIG. 1 is a structural schematic view of a frequency-detecting circuit according to a first embodiment of the present disclosure.

FIG. 1 is a structural schematic view of a frequency-detecting circuit 100 according to a first embodiment of the present disclosure. The frequency-detecting circuit 100 includes a pulse-narrowing circuit 10 and a judging-and-sampling circuit 20.

The pulse-narrowing circuit 10 is configured to receive a to-be-detected clock signal CK and perform at least one pulse-narrowing process for the to-be-detected clock signal CK. In some embodiments, each of the at least one pulse-narrowing process is configured to perform a first inversion for a current-level input clock signal, control a rising speed of a rising edge of a level transition or a falling speed of a falling edge of the level transition in a process of the first inversion to obtain a first inverted clock signal PSRDB (not shown in FIG. 1, referring to FIG. 3), and perform a second inversion for the first inverted clock signal PSRDB to obtain a current-level narrowed output clock signal PSRD.

Figure 2:
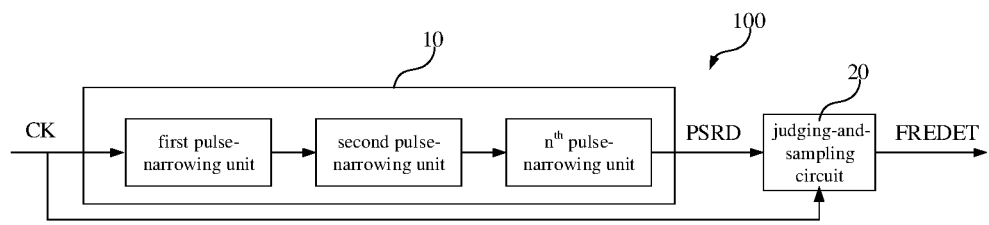
FIG. 2 is a structural schematic view of the frequency-detecting circuit according to a second embodiment of the present disclosure.

In some embodiments, the pulse-narrowing circuit 10 may narrow a logic low level of the to-be-detected clock signal CK. As shown in FIG. 2, the pulse-narrowing circuit 10 has a plurality of pulse-narrowing units, e.g., includes a first pulse unit, a second pulse unit, and a nth pulse unit, and n is a natural number greater than 2.

Figure 3:
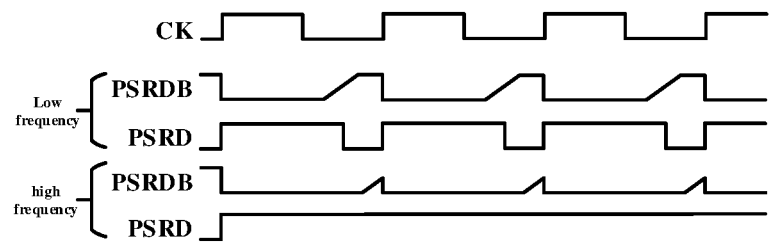
FIG. 3 is a schematic diagram of signal waveforms of each node in an application scenario according to the second embodiment of the present disclosure.

In some embodiments, each of the plurality of pulse-narrowing units may perform the pulse-narrowing process for the logic low level of a clock signal input by a previous-level pulse unit for one time. The pulse-narrowing circuit 10 has a detection-point frequency. As shown in FIG. 3, the pulse-narrowing circuit 10 performs the first inversion for an input clock signal CK, controls the rising speed of the rising edge of the level transition in the process of the first inversion to obtain the first inverted clock signal PSRDB, and performs the second inversion for the first inverted clock signal PSRDB to obtain the narrowed output clock signal PSRD. When a level of the input clock signal is changed to the rising edge, a logic high level is formed correspondingly. In this case, the first inversion is performed for the input clock signal, such that a state where the level is changed to the rising edge is inverted to a state where the level is changed to the falling edge, and a corresponding logic low level is obtained. When the level of the input clock signal is changed to the falling edge, the logic low level is formed correspondingly. In this case, when the state where the level is changed to the falling edge is inverted to the state where the level is changed to the rising edge, the rising speed of the rising edge of the level transition is controlled. The logic high level is formed after the transition is successful, while only a sawtooth-shaped level is formed in response to a transition failure. In an embodiment, a voltage value of the sawtooth-shaped level is constantly less than a logic threshold.

The first inverted clock signal PSRDB is obtained through performing the first inversion for the level of the input clock signal according to the above manner. In this case, a duration of the logic high level in the first inverted clock signal PSRDB is less than a duration of the logic low level in the input clock signal.

The second inversion is performed for the first inverted clock signal PSRDB to obtain the narrowed output clock signal PSRD.

In some embodiments, a threshold inversion is performed for the first inverted clock signal PSRDB during the second inversion. When the first inverted clock signal PSRDB meets a threshold at the logic low level, the logic low level is inverted to the logic high level. A ramp-shaped level exists between the logic low level of the first inverted clock signal PSRDB and the logic high level of the first inverted clock signal PSRDB due to controlling the rising speed of the rising edge of the level transition. A part of the ramp-shaped level meets the threshold. The part of the ramp-shaped level meeting the threshold is inverted to the logic high level, and a part of the ramp-shaped level not meeting the threshold is inverted to the logic low level. The first inverted clock signal PSRDB is inverted to the logic low level at the logic high level. In this way, the narrowed output clock signal PSRD is obtained.

A duration of the logic low level in the narrowed output clock signal PSRD is less than the duration of the logic low level in the input clock signal.

The pulse-narrowing circuit 10 acquires the first inverted clock signal PSRDB based on controlling the rising speed of the rising edge of the level transition, and the duration of the logic low level in the outputted narrowed output clock signal PSRD is less than the duration of the logic low level in the input clock signal.

The judging-and-sampling circuit 20 is coupled to the pulse-narrowing circuit 10, and configured to sample the narrowed output clock signal PSRD by employing the to-be-detected clock signal CK as a sampling clock signal to obtain a frequency indication signal FREDET. The frequency indication signal FREDET is configured to indicate a value range of a frequency of the to-be-detected clock signal CK.

When the frequency of the to-be-detected clock signal CK is less than the detection-point frequency, as a low frequency portion shown in FIG. 3, an obtained first inverted clock signal PSRDB may be successfully converted to the logic high level, such that the narrowed output clock signal PSRD also has a corresponding logic low level.

When the frequency of the to-be-detected clock signal CK is greater than the detection-point frequency, as a high frequency portion shown in FIG. 3, the obtained first inverted clock signal PSRDB fails to be converted to the logic high level, and only forms the sawtooth-shaped level, while a current period of the to-be-detected clock signal CK ends. In this way, the narrowed output clock signal PSRD has no corresponding logic low level, but has all logic high levels instead.

Figure 4:
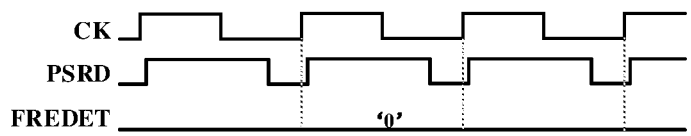
FIG. 4 is a sampling schematic diagram of a judging-and-sampling circuit according to the second embodiment of the present disclosure.

As shown in FIG. 4, when the judging-and-sampling circuit 20 continuously samples the narrowed output clock signal PSRD with a time point corresponding to the rising edge of the to-be-detected clock signal CK as a sampling point and obtained narrowed output clock signals PSRD are all logic low levels, an outputted frequency indication signal FREDET is 0. The frequency indication signal FREDET being 0 indicates the frequency of the to-be-detected clock signal CK is in a first frequency range. The narrowed output clock signal PSRD in FIG. 4 corresponds to the narrowed output clock signal PSRD in the low frequency portion of FIG. 3. In some embodiments, the narrowed output clock signal PSRD itself has a time difference from the to-be-detected clock signal CK for a circuit reason. Thus, the narrowed output clock signal PSRD has a delay relative to the to-be-detected clock signal CK, such that the narrowed output clock signal PSRD sampled with the time point corresponding to the rising edge of the to-be-detected clock signal CK as the sampling point may be the logic low level.

In other embodiments, the pulse-narrowing circuit 10 has a delay module capable of delaying an outputted narrowed output clock signal PSRD, such that the narrowed output clock signal PSRD has the delay relative to the to-be-detected clock signal CK.

In other embodiments, the judging-and-sampling circuit 20 has a delay module capable of delaying an inputted narrowed output clock signal PSRD, such that the narrowed output clock signal PSRD has the delay relative to the to-be-detected clock signal CK.

Figure 5:
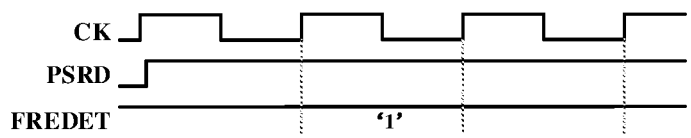
FIG. 5 is a second sampling schematic diagram of the judging-and-sampling circuit according to the second embodiment of the present disclosure.

As shown in FIG. 5, when the judging-and-sampling circuit 20 continuously samples the narrowed output clock signal PSRD with the time point corresponding to the rising edge of the to-be-detected clock signal CK as the sampling point and obtained narrowed output clock signals PSRD are all logic high levels, the outputted frequency indication signal FREDET is 1. The frequency indication signal FREDET being 1 indicates the frequency of the to-be-detected clock signal CK is in a second frequency range. The narrowed output clock signal PSRD in FIG. 5 corresponds to the narrowed output clock signal PSRD in the high frequency portion of FIG. 3.

In some embodiments, the pulse-narrowing circuit 10 may narrow the logic high level of the to-be-detected clock signal CK. The pulse-narrowing circuit 10 may include a plurality of pulse-narrowing units, each of the pulse-narrowing units may perform a pulse narrowing process for the logic low level of the to-be-detected clock signal CK. The pulse-narrowing circuit 10 has the detection-point frequency.

Figure 6:
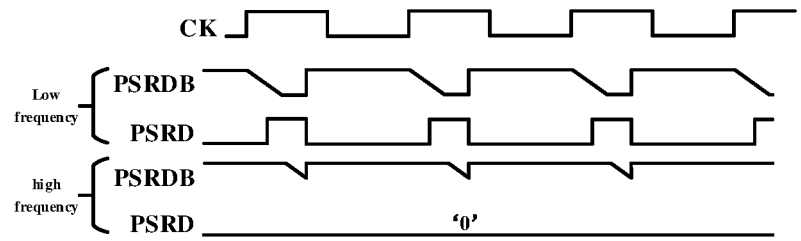
FIG. 6 is a schematic diagram of the signal waveforms of each node in another application scenario according to the second embodiment of the present disclosure.

For example, as shown in FIG. 6, the pulse-narrowing circuit 10 performs the first inversion for the input clock signal CK, controls the falling speed of the falling edge of the level transition in the process of the first inversion to obtain the first inverted clock signal PSRDB, and performs the second inversion for the first inverted clock signal PSRDB to obtain the narrowed output clock signal PSRD. When the level of the input clock signal is changed to the falling edge, the logic low level is formed correspondingly. In this case, the first inversion is performed for the input clock signal, such that the state where the level is changed to the falling edge is inverted to the state where the level is changed to the rising edge, and a corresponding logic high level is obtained. When the level of the input clock signal is changed to the rising edge, the logic high level is formed correspondingly. In this case, when the state where the level is changed to the rising edge is inverted to the state where the level is changed to the falling edge, the falling speed of the falling edge of the level transition is controlled. The logic low level is formed after the transition is successful, while only the sawtooth-shaped level is formed in response to the transition failure. In an embodiment, the voltage value of the sawtooth-shaped level is constantly less than the logic threshold.

The first inverted clock signal PSRDB is obtained through performing the first inversion for the level of the input clock signal according to the above manner. In this case, a duration of the logic low level in the first inverted clock signal PSRDB is less than a duration of the logic high level in the input clock signal.

The second inversion is performed for the first inverted clock signal PSRDB to obtain the narrowed output clock signal PSRD.

In some embodiments, the threshold inversion is performed for the first inverted clock signal PSRDB during the second inversion. When the first inverted clock signal PSRDB meets the threshold at the logic high level, the logic high level is inverted to the logic low level. The ramp-shaped level exists between the logic high level of the first inverted clock signal PSRDB and the logic low level of the first inverted clock signal PSRDB due to controlling the falling speed of the falling edge of the level transition. The part of the ramp-shaped level meets the threshold. The part of the ramp-shaped level meeting the threshold is inverted to the logic low level, and the part of the ramp-shaped level not meeting the threshold is inverted to the logic high level. The first inverted clock signal PSRDB is inverted to the logic high level at the logic low level. In this way, the narrowed output clock signal PSRD is obtained.

A duration of the logic high level in the narrowed output clock signal PSRD is less than the duration of the logic high level in the input clock signal.

The pulse-narrowing circuit 10 acquires the first inverted clock signal PSRDB based on controlling the falling speed of the falling edge of the level transition, and the duration of the logic high level in the outputted narrowed output clock signal PSRD is less than the duration of the logic high level in the input clock signal.

The judging-and-sampling circuit 20 is coupled to the pulse-narrowing circuit 10, and configured to sample the narrowed output clock signal PSRD by employing the to-be-detected clock signal CK as the sampling clock signal to obtain the frequency indication signal FREDET. The frequency indication signal FREDET is configured to indicate the value range of the frequency of the to-be-detected clock signal CK.

When the frequency of the to-be-detected clock signal CK is less than the detection-point frequency, as a low frequency portion shown in FIG. 6, an obtained first inverted clock signal PSRDB may be successfully converted to the logic low level, such that the narrowed output clock signal PSRD also has a corresponding logic high level.

When the frequency of the to-be-detected clock signal CK is greater than the detection-point frequency, as a high frequency portion shown in FIG. 6, the obtained first inverted clock signal PSRDB fails to be converted to the logic low level, and only forms the sawtooth-shaped level, while the current period of the to-be-detected clock signal CK ends. In this way, the narrowed output clock signal PSRD has no corresponding logic high level, but has all logic low levels instead.

Figure 7:
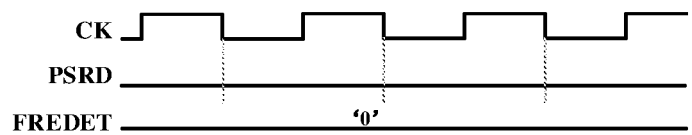
FIG. 7 is a third sampling schematic diagram of the judging-and-sampling circuit according to the second embodiment of the present disclosure.

As shown in FIG. 7, when the judging-and-sampling circuit 20 continuously samples the narrowed output clock signal PSRD with a time point corresponding to the falling edge of the to-be-detected clock signal CK as the sampling point and the obtained narrowed output clock signals PSRD are all the logic low levels, the outputted frequency indication signal FREDET is 0. The frequency indication signal FREDET being 0 indicates the frequency of the to-be-detected clock signal CK is in the second frequency range. The narrowed output clock signal PSRD in FIG. 7 corresponds to the narrowed output clock signal PSRD in the low frequency portion of FIG. 6. In some embodiments, the narrowed output clock signal PSRD itself has the time difference from the to-be-detected clock signal CK for the circuit reason. Thus, the narrowed output clock signal PSRD has the delay relative to the to-be-detected clock signal CK, such that the narrowed output clock signal PSRD sampled with the time point corresponding to the falling edge of the to-be-detected clock signal CK as the sampling point may be the logic low level.

In other embodiments, the pulse-narrowing circuit 10 has the delay module capable of delaying the outputted narrowed output clock signal PSRD, such that the narrowed output clock signal PSRD has the delay relative to the to-be-detected clock signal CK.

In other embodiments, the judging-and-sampling circuit 20 has the delay module capable of delaying the inputted narrowed output clock signal PSRD, such that the narrowed output clock signal PSRD has the delay relative to the to-be-detected clock signal CK.

Figure 8:
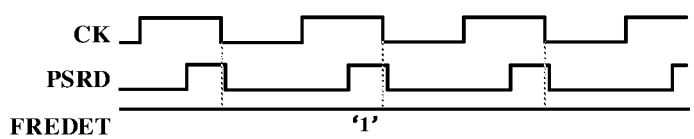
FIG. 8 is a fourth sampling schematic diagram of the judging-and-sampling circuit according to the second embodiment of the present disclosure.

As shown in FIG. 8, when the judging-and-sampling circuit 20 continuously samples the narrowed output clock signal PSRD with the time point corresponding to the falling edge of the to-be-detected clock signal CK as the sampling point and the obtained narrowed output clock signals PSRD are all the logic high levels, the outputted frequency indication signal FREDET is 1. The frequency indication signal FREDET being 1 indicates the frequency of the to-be-detected clock signal CK is in the first frequency range. The narrowed output clock signal PSRD in FIG. 8 corresponds to the narrowed output clock signal PSRD in the low frequency portion of FIG. 6.

In this embodiment, the pulse-narrowing circuit 10 controls the rising speed of the rising edge of the level transition or the falling speed of the falling edge of the level transition to obtain the first inverted clock signal PSRDB, and perform the second inversion for the first inverted clock signal PSRDB to obtain the narrowed output clock signal PSRD. In addition, the judging-and-sampling circuit 20 samples the narrowed output clock signal PSRD. by employing the to-be-detected clock signal as the sampling clock signal to obtain the frequency indication signal FREDET. The frequency indication signal FREDET is configured to indicate the value range of the frequency of the to-be-detected clock signal CK, so as to achieve a detection of the frequency of the to-be-detected clock signal CK. Further, in some scenarios where an accurate frequency is not required to be acquired, but only a frequency level (i.e., a high frequency or a low frequency) is required to be determined, the frequency range in which the to-be-detected clock signal CK is may be indicated directly by the frequency indication signal FREDET.

In some embodiments, the pulse-narrowing circuit 10 has at least one detection-point frequency. The pulse-narrowing circuit 10 narrows the to-be-detected clock signal CK based on the detection-point frequency to obtain the narrowed output clock signal PSRD. The judging-and-sampling circuit 20 is configured to sample the narrowed output clock signal by employing the to-be-detected clock signal CK as the sampling clock signal to determine whether the to-be-detected clock signal CK is greater than the detection-point frequency. The judging-and-sampling circuit 20 is configured to sample the narrowed output clock signal to obtain the frequency indication signal, and the frequency indication signal is configured to indicate whether the to-be-detected clock signal CK is greater than the detection-point frequency.

The detection-point frequency is determined based on an electronic component in the pulse-narrowing circuit 10. For example, when the pulse-narrowing circuit 10 includes a capacitor, the detection-point frequency may be determined based on capacitance of the capacitor. When the pulse-narrowing circuit 10 includes a MOS transistor, the detection-point frequency may be determined based on a parameter of the MOS transistor.

When the pulse-narrowing circuit 10 includes a current-limiting element such as a resistor or a current source, the detection-point frequency may be determined based on a resistance value of the resistor or a current value of the current source.

When the pulse-narrowing circuit 10 includes an inverter, the detection-point frequency may be determined based on a flip threshold point of the inverter.

The detection-point frequency is taken as a reference. When the frequency of the to-be-detected clock signal CK is greater than the detection-point frequency, the frequency of the to-be-detected clock signal CK is determined to be the high frequency. When the frequency of the to-be-detected clock signal CK is less than the detection-point frequency, the frequency of the to-be-detected clock signal CK is determined to be the low frequency.

In a scenario to control the rising speed of the rising edge of the level transition, as shown in FIG. 4, the to-be-detected clock signal CK is determined to be less than the detection-point frequency, in response to the whole of the frequency indication signal FREDET being a second logic signal.

It can be understood that the less the frequency of to-be-detected clock signal CK is, the greater the period is. When the pulse-narrowing circuit 10 narrows a pulse based on the detection-point frequency, the logic low level in a low-frequency to-be-detected clock signal CK is not narrowed to disappear. Thus, the narrowed output clock signal includes the logic low level. When the judging-and-sampling circuit 20 continuously samples the narrowed output clock signal PSRD with the time point corresponding to the rising edge of the to-be-detected clock signal CK as the sampling point and the obtained narrowed output clock signals PSRD are all the logic low levels, the outputted frequency indication signal FREDET is 0. In this case, a frequency indication signal FREDET0 is the second logic signal, and it is determined that the frequency of the to-be-detected clock signal CK is less than the detection-point frequency.

In a scenario to control the rising speed of the rising edge of the level transition, as shown in FIG. 5, the to-be-detected clock signal CK is determined to be greater than the detection-point frequency, in response to the whole of the frequency indication signal FREDET being a first logic signal.

It can be understood that the greater the frequency of to-be-detected clock signal CK is, the less the period is. When the pulse-narrowing circuit 10 narrows the pulse based on the detection-point frequency, the logic low level in a high-frequency to-be-detected clock signal CK is all narrowed to disappear. Thus, the narrowed output clock signal includes no logic low level. When the judging-and-sampling circuit 20 continuously samples the narrowed output clock signal PSRD with the time point corresponding to the rising edge of the to-be-detected clock signal CK as the sampling point and the obtained narrowed output clock signals PSRD are all the logic high levels, the outputted frequency indication signal FREDET is 1. In this case, a frequency indication signal FREDET1 is the first logic signal, and it is determined that the frequency of the to-be-detected clock signal CK is greater than the detection-point frequency.

In a scenario to control the falling speed of the falling edge of the level transition, as shown in FIG. 7, the to-be-detected clock signal CK is determined to be greater than the detection-point frequency, in response to the whole of the frequency indication signal FREDET being the first logic signal.

It can be understood that the greater the frequency of to-be-detected clock signal CK is, the less the period is. When the pulse-narrowing circuit 10 narrows the pulse based on the detection-point frequency, the logic high level in the high-frequency to-be-detected clock signal CK is all narrowed to disappear. Thus, the narrowed output clock signal includes no logic high level. When the judging-and-sampling circuit 20 continuously samples the narrowed output clock signal PSRD with the time point corresponding to the falling edge of the to-be-detected clock signal CK as the sampling point and the obtained narrowed output clock signals PSRD are all the logic low levels, the outputted frequency indication signal FREDET is 0. In this case, the frequency indication signal FREDET0 is the first logic signal, and it is determined that the frequency of the to-be-detected clock signal CK is greater than the detection-point frequency.

In a scenario to control the falling speed of the falling edge of the level transition, as shown in FIG. 8, the to-be-detected clock signal CK is determined to be less than the detection-point frequency, in response to the whole of the frequency indication signal FREDET being the second logic signal.

It can be understood that the less the frequency of to-be-detected clock signal CK is, the greater the period is. When the pulse-narrowing circuit 10 narrows the pulse based on the detection-point frequency, the logic high level in the low-frequency to-be-detected clock signal CK is not narrowed to disappear. Thus, the narrowed output clock signal includes the logic high level. When the judging-and-sampling circuit 20 continuously samples the narrowed output clock signal PSRD with the time point corresponding to the falling edge of the to-be-detected clock signal CK as the sampling point and the obtained narrowed output clock signals PSRD are all the logic high levels, the outputted frequency indication signal FREDET is 1. In this case, the frequency indication signal FREDET1 is the second logic signal, and it is determined that the frequency of the to-be-detected clock signal CK is less than the detection-point frequency.

In some embodiments, the pulse-narrowing circuit 10 includes M pulse-narrowing units, each of the pulse-narrowing units is coupled to a previous pulse-narrowing unit, and configured to perform one of the at least one pulse narrowing process by employing a previous-level narrowed output clock signal PSRD of the previous pulse-narrowing unit as a current-level input clock signal thereof, so as to obtain a current-level narrowed output clock signal PSRD. M is a natural number greater than 1. For example, M may be 2, 3, 4, 5, or 6.

The first one of the M pulse-narrowing units is configured to receive the to-be-detected clock signal, and perform the first one of the at least one pulse narrowing process by employing the to-be-detected clock signal as a first-level input clock signal thereof.

In some embodiments, each of the pulse-narrowing units has the same pulse-narrowing capability.

In other embodiments, the pulse-narrowing units have different pulse-narrowing capabilities, respectively. The previous pulse-narrowing unit may have a pulse-narrowing capability higher than a pulse-narrowing capability higher of a current pulse-narrowing unit. In this way, a narrowing level of the narrowed output clock signal PSRD may be increased in the previous pulse-narrowing unit, such that the number of the pulse-narrowing units may be reduced.

In some embodiments, each of the above pulse-narrowing units includes a first inversion circuit and a second inversion circuit. The first inversion circuit is a delayed inversion circuit and configured to perform the first inversion for a received input clock signal, and control the rising speed of the rising edge of the level transition or the falling speed of the falling edge of the level transition by the current-limiting element in a process of the first inversion, to obtain the first inverted clock signal PSRDB. The second inversion circuit is a threshold inversion circuit and configured to perform the second inversion for the first inverted clock signal PSRDB to obtain the narrowed output clock signal. In the following embodiments, the current-limiting element may be a second switching transistor Q2 in FIG. 9, a resistor R1 in FIG. 10, a current source I in FIG. 11, a second switching transistor Q2 in FIG. 12, a resistor R1 in FIG. 13, or a current source I in FIG. 14.

Figure 9:
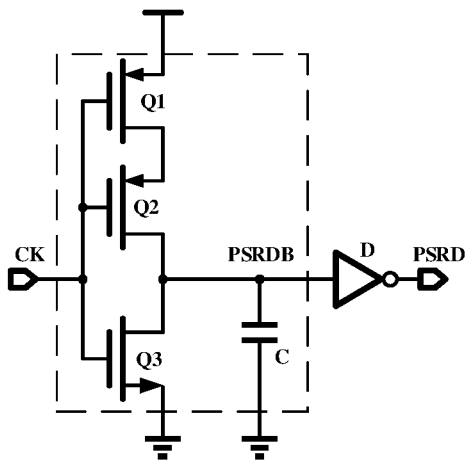
FIG. 9 is a structural schematic view of a pulse-narrowing unit according to an embodiment of the present disclosure.

In some embodiments, in the scenario to control the rising speed of the rising edge of the level transition, as shown in FIG. 9, the first inversion circuit includes a first switching transistor Q1, the second switching transistor Q2, a third switching transistor Q3, and a capacitor C, and the second inversion circuit includes the inverter D.

The first switching transistor Q1 has a first terminal configured to receive an operating voltage. The second switching transistor Q2 has a first terminal coupled to a second terminal of the first switching transistor Q1. The third switching transistor Q3 has a first terminal coupled to a second terminal of the second switching transistor Q2, and a second terminal grounded. The capacitor C has a first terminal coupled to the first terminal of the third switching transistor Q1, and a second terminal grounded.

A control terminal of the first switching transistor Q1, a control terminal of the second switching transistor Q2, and a control terminal of the third switching transistor Q3 are configured to receive the to-be-detected clock signal CK. The third switching transistor Q3 is controlled to be turned on to discharge the capacitor C in response to the to-be-detected clock signal CK being the logic high level. The first switching transistor Q1 and the second switching transistor Q2 are controlled to be turned on to charge the capacitor C in response to the to-be-detected clock signal CK being the logic low level, and the second switching transistor Q2 is served as the current-limiting element and configured to control the rising speed of the rising edge of the level transition so as to obtain the first inverted clock signal PSRDB.

During a pulse period having a width in which the to-be-detected clock signal CK is the logic high level, the third switching transistor Q3 is controlled to be turned on, and the first switching transistor Q1 and the second switching transistor Q2 are controlled to be cut off, to discharge the capacitor C. In a process of discharging, the first inverted clock signal PSRDB obtained correspondingly is the logic low level. During a pulse period having a width in which the to-be-detected clock signal CK is the logic low level, the first switching transistor Q1 and the second switching transistor Q2 are controlled to be turned on, and the third switching transistor Q3 is controlled to be cut off, to charge the capacitor C, and control the rising speed of the rising edge of the level transition. In a process of charging, the first inverted clock signal PSRDB obtained correspondingly is a ramp-shaped logic level in response to a failure control of the rising speed of the rising edge of the level transition, while the first inverted clock signal PSRDB obtained correspondingly is the logic high level in response to a successful control of the rising speed of the rising edge of the level transition.

In subsequence, the second inversion is performed for the first inverted clock signal PSRDB through the inverter D, to obtain the narrowed output clock signal PSRD.

It can be understood that when the third switching transistor Q3 is controlled to be turned on and the first switching transistor Q1 and the second switching transistor Q2 are controlled to be cut off, the capacitor C may be discharged quickly since the first terminal of the capacitor C is coupled to both the first terminal of the third switching transistor Q3 and the second terminal of the second switching transistor Q2. When the first switching transistor Q1 and the second switching transistor Q2 are controlled to be turned on, and the third switching transistor Q3 is controlled to be cut off, a speed of charging the capacitor C is limited since a charging loop includes the first switching transistor Q1 and the second switching transistor Q2.

In an embodiment, the first switching transistor Q1 is a pMOS transistor, the second switching transistor Q2 is the pMOS transistor, and the third switching transistor Q3 is an nMOS transistor.

Figure 10:
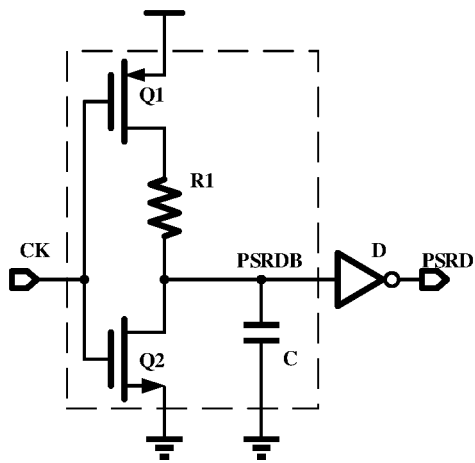
FIG. 10 is a structural schematic view of the pulse-narrowing unit according to another embodiment of the present disclosure.

In some embodiments, in the scenario to control the rising speed of the rising edge of the level transition, as shown in FIG. 10, the first inversion circuit includes the first switching transistor Q1, a resistor R1, the second switching transistor Q2, and the capacitor C, and the second inversion circuit includes the inverter D.

The first switching transistor Q1 has the first terminal configured to receive the operating voltage. The resistor R1 has a first terminal coupled to the second terminal of the first switching transistor Q1. The second switching transistor Q2 has the first terminal coupled to a second terminal of the resistor R1, and the second terminal grounded. The capacitor C has the first terminal coupled to the first terminal of the second switching transistor Q2, and the second terminal grounded.

The control terminal of the first switching transistor Q1 and the control terminal of the second switching transistor Q2 are configured to receive the to-be-detected clock signal CK. The second switching transistor Q2 is controlled to be turned on to discharge the capacitor C in response to the to-be-detected clock signal CK being the logic high level, the first switching transistor Q1 is controlled to be turned on to charge the capacitor C in response to the to-be-detected clock signal CK being the logic low level, and the resistor R1 is served as the current-limiting element and configured to control the rising speed of the rising edge of the level transition so as to obtain the first inverted clock signal PSRDB.

During the pulse period having the width in which the to-be-detected clock signal CK is the logic high level, the second switching transistor Q2 is controlled to be turned on, and the first switching transistor Q1 is controlled to be cut off, to discharge the capacitor C. In the process of discharging, the first inverted clock signal PSRDB obtained correspondingly is the logic low level. During the pulse period having the width in which the to-be-detected clock signal CK is the logic low level, the first switching transistor Q1 and the second switching transistor Q2 are controlled to be cut off, to charge the capacitor C and control the rising speed of the rising edge of the level transition. In the process of charging, the first inverted clock signal PSRDB obtained correspondingly is the ramp-shaped logic level in response to the failure control of the rising speed of the rising edge of the level transition, while the first inverted clock signal PSRDB obtained correspondingly is the logic high level in response to the successful control of the rising speed of the rising edge of the level transition.

In subsequence, the second inversion is performed for the first inverted clock signal PSRDB through the inverter D, to obtain the narrowed output clock signal PSRD.

It can be understood that when the second switching transistor Q2 is controlled to be turned on and the first switching transistor Q1 is controlled to be cut off, the capacitor C may be discharged quickly since the first terminal of the capacitor C is coupled to both the first terminal of the second switching transistor Q2 and the second terminal of the resistor R1. When the first switching transistor Q1 is controlled to be turned on, and the second switching transistor Q2 is controlled to be cut off, the speed of charging the capacitor C is limited since the charging loop includes the resistor R1.

In an embodiment, the first switching transistor Q1 is the pMOS transistor, the second switching transistor Q2 the nMOS transistor.

Figure 11:
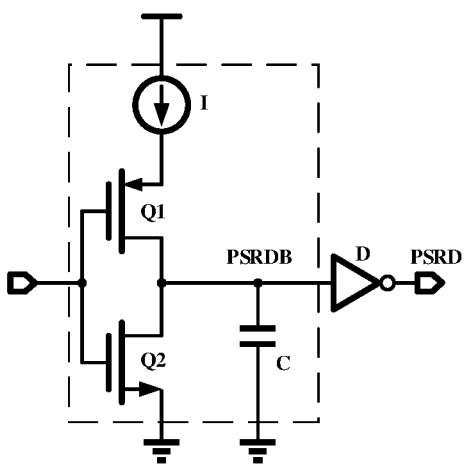
FIG. 11 is a structural schematic view of the pulse-narrowing unit according to another embodiment of the present disclosure.

In some embodiments, in the scenario to control the rising speed of the rising edge of the level transition, as shown in FIG. 11, the first inversion circuit includes the current source I, the first switching transistor Q1, the second switching transistor Q2, and the capacitor C, and the second inversion circuit includes the inverter D.

The first switching transistor Q1 has the first terminal coupled to the current source I. The second switching transistor Q2 has the first terminal coupled to the second terminal of the first switching transistor Q1, and a second terminal grounded. The capacitor C has the first terminal coupled to the first terminal of the second switching transistor Q2, and the second terminal grounded.

The control terminal of the first switching transistor Q1 and the control terminal of the second switching transistor Q2 are configured to receive the to-be-detected clock signal CK. The second switching transistor Q2 is controlled to be turned on to discharge the capacitor C in response to the to-be-detected clock signal CK being the logic high level. The first switching transistor Q1 is controlled to be turned on to charge the capacitor C in response to the to-be-detected clock signal CK being the logic low level, and the current source I is served as the current-limiting element and configured to control the rising speed of the rising edge of the level transition so as to obtain the first inverted clock signal PSRDB.

During the pulse period having the width in which the to-be-detected clock signal CK is the logic high level, the second switching transistor Q2 is controlled to be turned on, and the first switching transistor Q1 is controlled to be cut off, to discharge the capacitor C. In the process of discharging, the first inverted clock signal PSRDB obtained correspondingly is the logic low level. During the pulse period having the width in which the to-be-detected clock signal CK is the logic low level, the first switching transistor Q1 is controlled to be turned on, and the second switching transistor Q2 is controlled to be cut off, to charge the capacitor C, and control the rising speed of the rising edge of the level transition. In the process of charging, the first inverted clock signal PSRDB obtained correspondingly is the ramp-shaped logic level in response to the failure control of the rising speed of the rising edge of the level transition, while the first inverted clock signal PSRDB obtained correspondingly is the logic high level in response to the successful control of the rising speed of the rising edge of the level transition.

In subsequence, the second inversion is performed for the first inverted clock signal PSRDB through the inverter D, to obtain the narrowed output clock signal PSRD.

It can be understood that when the second switching transistor Q2 is controlled to be turned on and the first switching transistor Q1 is controlled to be cut off, the capacitor C may be discharged quickly since the first terminal of the capacitor C is coupled to both the first terminal of the second switching transistor Q2 and the second terminal of the first switching transistor Q1. When the first switching transistor Q1 is controlled to be turned on, and the second switching transistor Q2 is controlled to be cut off, the speed of charging the capacitor C is limited since the charging loop includes the current source I.

In an embodiment, the first switching transistor Q1 is the pMOS transistor, the second switching transistor Q2 is the nMOS transistor.

Figure 12:
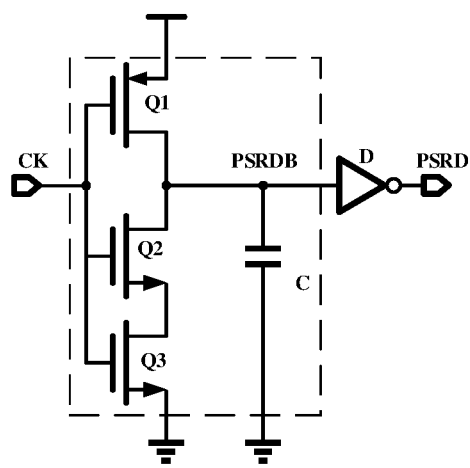
FIG. 12 is a structural schematic view of the pulse-narrowing unit according to another embodiment of the present disclosure.

In some embodiments, in the scenario to control the falling speed of the falling edge of the level transition, as shown in FIG. 12, the first inversion circuit includes the first switching transistor Q1, the second switching transistor Q2, the third switching transistor Q3, and the capacitor C, and the second inversion circuit includes the inverter D.

The first switching transistor Q1 has the first terminal configured to receive the operating voltage. The second switching transistor Q2 has the first terminal coupled to the second terminal of the first switching transistor Q1. The third switching transistor Q3 has the first terminal coupled to the second terminal of the second switching transistor Q2, and the second terminal grounded. The capacitor C has the first terminal coupled to the first terminal of the second switching transistor Q2, and the second terminal grounded.

The control terminal of the first switching transistor Q1, the control terminal of the second switching transistor Q2, and the control terminal of the third switching transistor Q3 are configured to receive the to-be-detected clock signal CK. The first switching transistor Q1 is controlled to be turned on to charge the capacitor C in response to the to-be-detected clock signal CK being the logic low level. The second switching transistor Q2 and the third switching transistor Q3 are controlled to be turned on to discharge the capacitor C in response to the to-be-detected clock signal CK being the logic high level, and the second switching transistor Q2 is served as the current-limiting element and configured to control the falling speed of the falling edge of the level transition so as to obtain the first inverted clock signal PSRDB.

During the pulse period having the width in which the to-be-detected clock signal CK is the logic low level, the first switching transistor Q1 is controlled to be turned on, and the second switching transistor Q2 and the third switching transistor Q3 are controlled to be cut off, to charge the capacitor C. In the process of charging, the first inverted clock signal PSRDB obtained correspondingly is the logic high level. During the pulse period having the width in which the to-be-detected clock signal CK is the logic high level, the second switching transistor Q2 and the third switching transistor Q3 are controlled to be turned on, and the first switching transistor Q1 is controlled to be cut off, to discharge the capacitor C, and control the falling speed of the falling edge of the level transition. In the process of discharging, the first inverted clock signal PSRDB obtained correspondingly is the ramp-shaped logic level in response to a failure control of the falling speed of the falling edge of the level transition, while the first inverted clock signal PSRDB obtained correspondingly is the logic low level in response to a successful control of the falling speed of the falling edge of the level transition.

In subsequence, the second inversion is performed for the first inverted clock signal PSRDB through the inverter D, to obtain the narrowed output clock signal PSRD.

It can be understood that when the first switching transistor Q1 is controlled to be turned on and the second switching transistor Q2 and the third switching transistor Q3 are controlled to be cut off, the capacitor C may be charged quickly since the first terminal of the capacitor C is coupled to both the first terminal of the second switching transistor Q2 and the second terminal of the first switching transistor Q1. When the second switching transistor Q2 and the third switching transistor Q3 are controlled to be turned on, and the first switching transistor Q1 is controlled to be cut off, a speed of discharging the capacitor C is limited since a discharging loop includes the second switching transistor Q2 and the third switching transistor Q3.

In an embodiment, the first switching transistor Q1 is a pMOS transistor, the second switching transistor Q2 is the nMOS transistor, and the third switching transistor Q3 is the nMOS transistor.

Figure 13:
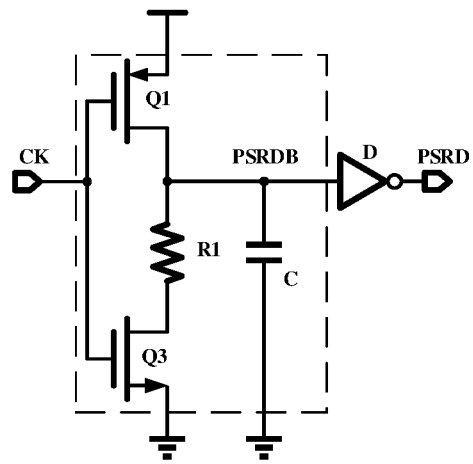
FIG. 13 is a structural schematic view of the pulse-narrowing unit according to another embodiment of the present disclosure.

In some embodiments, in the scenario to control the falling speed of the falling edge of the level transition, as shown in FIG. 13, the first inversion circuit includes the first switching transistor Q1, the resistor R1, the second switching transistor Q2, and the capacitor C, and the second inversion circuit includes the inverter D.

The first switching transistor Q1 has the first terminal configured to receive the operating voltage. The resistor R1 has the first terminal coupled to the second terminal of the first switching transistor Q1. The second switching transistor Q2 has the first terminal coupled to the second terminal of the resistor R1, and the second terminal grounded. The capacitor C has the first terminal coupled to the first terminal of the resistor R1, and the second terminal grounded.

The control terminal of the first switching transistor Q1 and the control terminal of the second switching transistor Q2 are configured to receive the to-be-detected clock signal CK. The first switching transistor Q1 is controlled to be turned on to charge the capacitor C in response to the to-be-detected clock signal CK being the logic low level. The second switching transistor Q2 is controlled to be turned on to discharge the capacitor C in response to the to-be-detected clock signal CK being the logic high level, and the resistor R1 is served as the current-limiting element and configured to control the falling speed of the falling edge of the level transition so as to obtain the first inverted clock signal PSRDB.

During the pulse period having the width in which the to-be-detected clock signal CK is the logic low level, the first switching transistor Q1 is controlled to be turned on, and the second switching transistor Q2 is controlled to be cut off, to charge the capacitor C. In the process of charging, the first inverted clock signal PSRDB obtained correspondingly is the logic high level. During the pulse period having the width in which the to-be-detected clock signal CK is the logic high level, the second switching transistor Q2 is controlled to be turned on, and the first switching transistor Q1 is controlled to be cut off, to discharge the capacitor C and control the falling speed of the falling edge of the level transition. In the process of discharging, the first inverted clock signal PSRDB obtained correspondingly is the ramp-shaped logic level in response to the failure control of the falling speed of the falling edge of the level transition, while the first inverted clock signal PSRDB obtained correspondingly is the logic low level in response to the successful control of the falling speed of the falling edge of the level transition.

In subsequence, the second inversion is performed for the first inverted clock signal PSRDB through the inverter D, to obtain the narrowed output clock signal PSRD.

It can be understood that when the first switching transistor Q1 is controlled to be turned on and the second switching transistor Q2 is controlled to be cut off, the capacitor C may be charged quickly since the first terminal of the capacitor C is coupled to both the first terminal of the second switching transistor Q2 and the second terminal of the first switching transistor Q1. When the second switching transistor Q2 is controlled to be turned on, and the first switching transistor Q1 is controlled to be cut off, the speed of discharging the capacitor C is limited since the discharging loop includes the resistor R1.

In an embodiment, the first switching transistor Q1 is the pMOS transistor, the second switching transistor Q2 the nMOS transistor.

Figure 14:
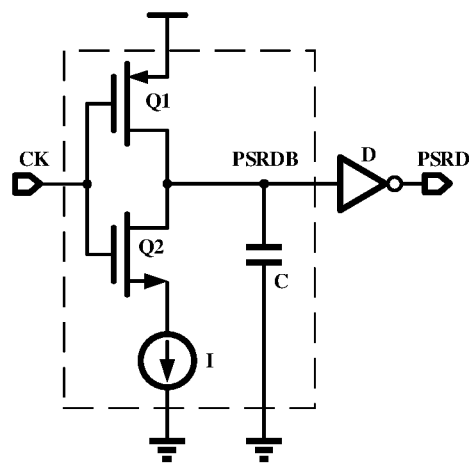
FIG. 14 is a structural schematic view of the pulse-narrowing unit according to another embodiment of the present disclosure.

In some embodiments, in the scenario to control the falling speed of the falling edge of the level transition, as shown in FIG. 14, the first inversion circuit includes the current source I, the first switching transistor Q1, the second switching transistor Q2, and the capacitor C, and the second inversion circuit includes the inverter D.

The first switching transistor Q1 has the first terminal configured to receive the operating voltage. The second switching transistor Q2 has the first terminal coupled to the second terminal of the first switching transistor Q1. The capacitor C has the first terminal coupled to the first terminal of the second switching transistor Q2. The current source I has a first terminal coupled to the second terminal of the first switching transistor Q1, and a second terminal grounded.

The control terminal of the first switching transistor Q1 and the control terminal of the second switching transistor Q2 are configured to receive the to-be-detected clock signal CK. The first switching transistor Q1 is controlled to be turned on to charge the capacitor C in response to the to-be-detected clock signal CK being the logic low level. The second switching transistor Q2 is controlled to be turned on to discharge the capacitor C in response to the to-be-detected clock signal CK being the logic high level, and the current source I is served as the current-limiting element and configured to control the falling speed of the falling edge of the level transition so as to obtain the first inverted clock signal PSRDB.

During the pulse period having the width in which the to-be-detected clock signal CK is the logic low level, the first switching transistor Q1 is controlled to be turned on, and the second switching transistor Q2 is controlled to be cut off, to charge the capacitor C. In the process of charging, the first inverted clock signal PSRDB obtained correspondingly is the logic high level. During the pulse period having the width in which the to-be-detected clock signal CK is the logic high level, the second switching transistor Q2 is controlled to be turned on, and the first switching transistor Q1 is controlled to be cut off, to discharge the capacitor C, and control the falling speed of the falling edge of the level transition. In the process of discharging, the first inverted clock signal PSRDB obtained correspondingly is the ramp-shaped logic level in response to the failure control of the falling speed of the rising edge of the level transition, while the first inverted clock signal PSRDB obtained correspondingly is the logic low level in response to the successful control of the falling speed of the rising edge of the level transition.

In subsequence, the second inversion is performed for the first inverted clock signal PSRDB through the inverter D, to obtain the narrowed output clock signal PSRD.

It can be understood that when the first switching transistor Q1 is controlled to be turned on and the second switching transistor Q2 is controlled to be cut off, the capacitor C may be charged quickly since the first terminal of the capacitor C is coupled to both the first terminal of the second switching transistor Q2 and the second terminal of the first switching transistor Q1. When the second switching transistor Q2 is controlled to be turned on, and the first switching transistor Q1 is controlled to be cut off, the speed of discharging the capacitor C is limited since the discharging loop includes the current source I.

In an embodiment, the first switching transistor Q1 is the pMOS transistor, the second switching transistor Q2 is the nMOS transistor.

Figure 15:
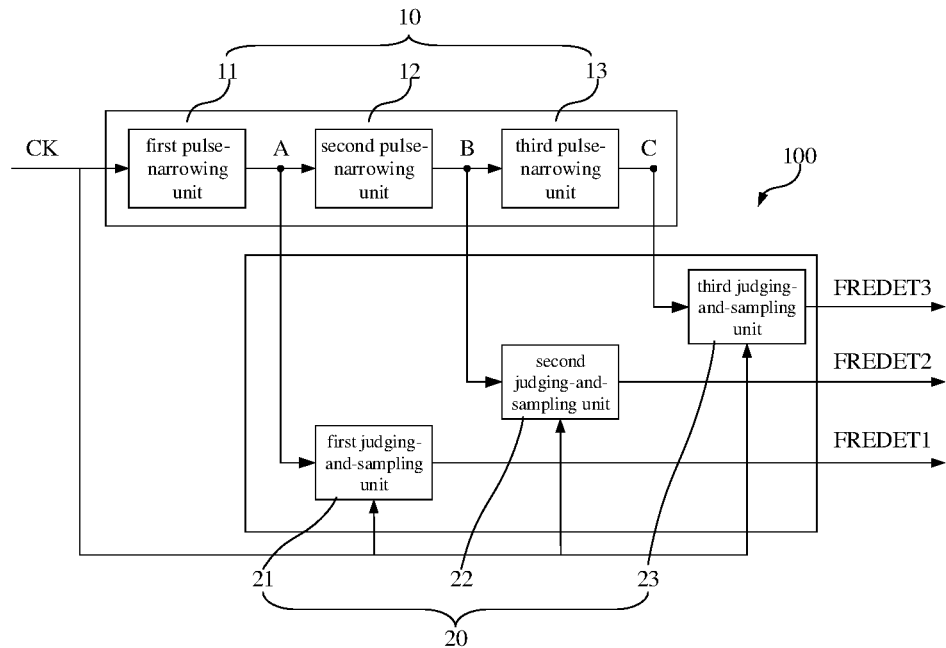
FIG. 15 is a structural schematic view of the frequency-detecting circuit according to a third embodiment of the present disclosure.

In some embodiments, in conjunction with FIG. 15, M being 3 is taken as an example.

The pulse-narrowing circuit 10 includes a first pulse-narrowing unit 11, a second pulse-narrowing unit 12, and a third pulse-narrowing unit 13.

The first-pulse-narrowing unit 11 receives the to-be-detected clock signal CK, and performs one pulse narrowing process by employing the to-be-detected clock signal CK as the current-level input clock signal thereof, so as to obtain the current-level narrowed output clock signal thereof.

The second pulse-narrowing unit 12 is coupled to the first pulse-narrowing unit, and performs one pulse narrowing process by employing the narrowed output clock signal outputted by the first pulse-narrowing unit as the current-level input clock signal thereof, so as to obtain the current-level narrowed output clock signal thereof.

The third pulse-narrowing unit 13 is coupled to the second pulse-narrowing unit, and performs one pulse narrowing process by employing the narrowed output clock signal outputted by the second pulse-narrowing unit as the current-level input clock signal thereof, so as to obtain the current-level narrowed output clock signal thereof.

The first pulse-narrowing unit 11, the second pulse-narrowing unit 12, and the third pulse-narrowing unit 13 may perform a pulse-narrowing process for the logic low level or the logic high level in the input clock signal. It can be understood that the first pulse-narrowing unit 11, the second pulse-narrowing unit 12, and the third pulse-narrowing unit 13 all perform the pulse-narrowing process for the logic low level in the input clock signal; or the first pulse-narrowing unit 11, the second pulse-narrowing unit 12, and the third pulse-narrowing unit 13 all perform the pulse-narrowing process for the logic high level in the input clock signal.

In some embodiments, the pulse-narrowing circuit 10 is configured to provide N detection-point frequencies to obtain N narrowed output clock signals. A coupling point between any of the pulse-narrowing units and a next-level pulse-narrowing unit, and/or an outputting terminal of the last-level pulse-narrowing unit is able to be an outputting terminal of the pulse-narrowing circuit 10 for outputting a narrowed output clock signal in an individual path. The narrowed output clock signal herein may be the narrowed output clock signal PSRD described above. Each narrowed output clock signal in each individual path corresponds to a corresponding detection-point frequency, which is determined by pulse-narrowing units previous to a corresponding outputting terminal of the pulse-narrowing circuit 10 in each individual path.

The judging-and-sampling circuit 20 includes N judging-and-sampling units. Each of the judging-and-sampling units is coupled to a corresponding one of outputting terminals of the pulse-narrowing circuit 10, to receive a narrowed output clock signal in a corresponding individual path, and receive the to-be-detected clock signal CK, so as to obtain a corresponding frequency indication signal FREDET in an individual path. N is a natural number less than or equal to M. For example, N may be 2, 3, 4, 5 or 6.

N being 3 is taken as an example.

The pulse-narrowing circuit 10 is configured to provide 3 detection-point frequencies to obtain 3 narrowed output clock signals. The coupling point between any of the pulse-narrowing units and a next-level pulse-narrowing unit, and/or the outputting terminal of the last-level pulse-narrowing unit (e.g., a coupling point A, a coupling point B, and a coupling point C shown in FIG. 15) is able to be the outputting terminal of the pulse-narrowing circuit 10 for outputting the narrowed output clock signal in the individual path. The narrowed output clock signal herein may be the narrowed output clock signal PSRD described above. Each narrowed output clock signal in each individual path corresponds to the corresponding detection-point frequency, which is determined by pulse-narrowing units previous to the corresponding outputting terminal of the pulse-narrowing circuit 10 in each individual path.

A detection-point frequency of the coupling point A is determined by the first pulse-narrowing unit 11, a detection-point frequency of the coupling point B is determined by the first pulse-narrowing unit 11 and the second pulse-narrowing unit 12, and a detection-point frequency of the coupling point C is determined by the first pulse-narrowing unit 11, the second pulse-narrowing unit 12, and the third pulse-narrowing unit 13.

The judging-and-sampling circuit 20 includes 3 judging-and-sampling units, i.e., a first judging-and-sampling unit 21, a second judging-and-sampling unit 22, and a third judging-and-sampling unit 23.

The first judging-and-sampling unit 21 is coupled to the coupling point A to receive the narrowed output clock signal in the corresponding individual path, and receive the to-be-detected clock signal CK, so as to obtain the corresponding frequency indication signal FREDET1 in the individual path.

The second judging-and-sampling unit 22 is coupled to the coupling point B to receive the narrowed output clock signal in the corresponding individual path, and receive the to-be-detected clock signal CK, so as to obtain the corresponding frequency indication signal FREDET2 in the individual path.

The third judging-and-sampling unit 23 is coupled to the coupling point C to receive the narrowed output clock signal in the corresponding individual path, and receive the to-be-detected clock signal CK, so as to obtain the corresponding frequency indication signal FREDET3 in the individual path.

In this way, the value range of the frequency of the to-be-detected clock signal CK may be determined in combination with an obtained frequency indication signal FREDET of each judging-and-sampling unit.

In some embodiments, the frequency indication signal FREDET is indicated 0 or 1. In the scenario to control the rising speed of the rising edge of the level transition, the frequency indication signal FREDET being 0 indicates the frequency of the to-be-detected clock signal CK is less than the detection-point frequency, while the frequency indication signal FREDET being 1 indicates the frequency of the to-be-detected clock signal CK is greater than the detection-point frequency.

The detection-point frequency of the coupling point A is defined as f1, the detection-point frequency of the coupling point B is defined as f2, and the detection-point frequency of the coupling point C is defined as f3. f1>f2>f3.

The frequency indication signal obtained by the judging-and-sampling circuit 20 is indicated by XYZ. X indicates the frequency indication signal obtained by the first judging-and-sampling unit, Y indicates the frequency indication signal obtained by the second judging-and-sampling unit, and Z indicates the frequency indication signal obtained by the third judging-and-sampling unit.

When frequency indication signals obtained by the 3 judging-and-sampling units are 111, the frequency of the to-be-detected clock signal CK is greater than f1. That is, the frequency of the to-be-detected clock signal CK is greater than the detection-point frequency of the coupling point A.

When the frequency indication signals obtained by the 3 judging-and-sampling units are 011, the frequency of the to-be-detected clock signal CK is greater than f2 and less than f1. That is, the frequency of the to-be-detected clock signal CK is greater than the detection-point frequency of the coupling point B and less than the detection-point frequency of the coupling point A.

When the frequency indication signals obtained by the 3 judging-and-sampling units are 001, the frequency of the to-be-detected clock signal CK is greater than f3 and less than f2. That is, the frequency of the to-be-detected clock signal CK is greater than the detection-point frequency of the coupling point C and less than the detection-point frequency of the coupling point B.

When the frequency indication signals obtained by the 3 judging-and-sampling units are 000, the frequency of the to-be-detected clock signal CK is less than f3. That is, the frequency of the to-be-detected clock signal CK is less than the detection-point frequency of the coupling point C.

In the scenario to control the falling speed of the falling edge of the level transition, the frequency indication signal FREDET being 0 indicates the frequency of the to-be-detected clock signal CK is greater than the detection-point frequency, while the frequency indication signal FREDET being 1 indicates the frequency of the to-be-detected clock signal CK is less than the detection-point frequency.

The detection-point frequency of the coupling point A is defined as f1, the detection-point frequency of the coupling point B is defined as f2, and the detection-point frequency of the coupling point C is defined as f3. f1>f2>f3.

The frequency indication signal obtained by the judging-and-sampling circuit 20 is indicated by XYZ. X indicates the frequency indication signal obtained by the first judging-and-sampling unit, Y indicates the frequency indication signal obtained by the second judging-and-sampling unit, and Z indicates the frequency indication signal obtained by the third judging-and-sampling unit.

When the frequency indication signals obtained by the 3 judging-and-sampling units are 000, the frequency of the to-be-detected clock signal CK is greater than f1. That is, the frequency of the to-be-detected clock signal CK is greater than the detection-point frequency of the coupling point A.

When the frequency indication signals obtained by the 3 judging-and-sampling units are 100, the frequency of the to-be-detected clock signal CK is greater than f2 and less than f1. That is, the frequency of the to-be-detected clock signal CK is greater than the detection-point frequency of the coupling point B and less than the detection-point frequency of the coupling point A.

When the frequency indication signals obtained by the 3 judging-and-sampling units are 110, the frequency of the to-be-detected clock signal CK is greater than f3 and less than f2. That is, the frequency of the to-be-detected clock signal CK is greater than the detection-point frequency of the coupling point C and less than the detection-point frequency of the coupling point B.

When the frequency indication signals obtained by the 3 judging-and-sampling units are 111, the frequency of the to-be-detected clock signal CK is less than f3. That is, the frequency of the to-be-detected clock signal CK is less than the detection-point frequency of the coupling point C.

In other embodiments, the frequency indication signal FREDET obtained by the last-level judging-and-sampling unit is taken as a determining basis for frequency detection.

Figure 16:
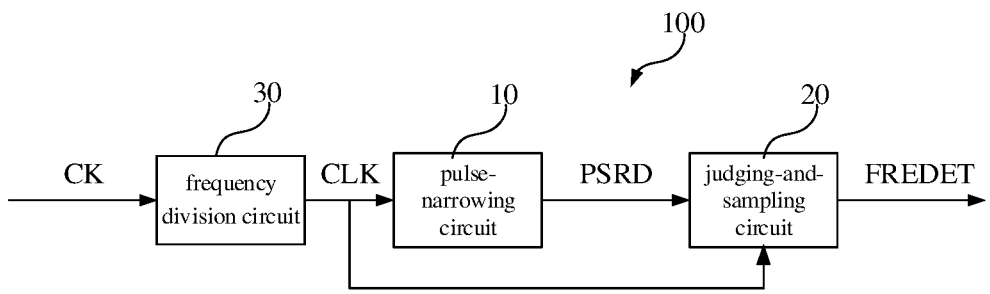
FIG. 16 is a structural schematic view of the frequency-detecting circuit according to a fourth embodiment of the present disclosure.

In some embodiments, for protecting a result of the frequency detection from an influence of a duty cycle of the to-be-detected clock signal CK, as shown in FIG. 16, the frequency-detecting circuit 100 includes the pulse-narrowing circuit 10, the judging-and-sampling circuit 20, and a frequency division circuit 30.

The frequency division circuit 30 is configured to receive the to-be-detected clock signal CK, divide the frequency of the to-be-detected clock signal CK, and output a frequency division clock signal CLK.

The pulse-narrowing circuit 10 is coupled to an output terminal of the frequency division circuit 30 and configured to perform the at least one pulse-narrowing process for the frequency division clock signal CLK to obtain the narrowed output clock signal PSRD.

The judging-and-sampling circuit 20 is configured to sample the narrowed output clock signal PSRD by employing the frequency division clock signal CLK as the sampling clock signal, to obtain the frequency indication signal FREDET.

In some embodiments, the frequency division circuit 30 may be a two-frequency division circuit, a four-frequency division circuit, or an eight-frequency division circuit. It can be understood that the frequency division circuit 30 may be a 2n-fold frequency division circuit, and n is a natural number greater than 0.

In some embodiments, the frequency division circuit 30 is illustrated as the two-frequency division circuit.

Figure 17:
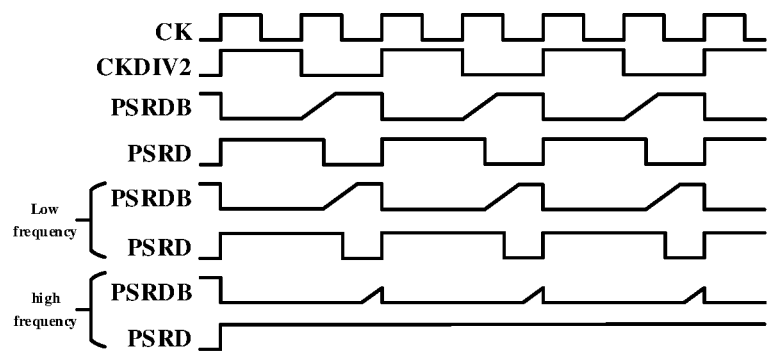
FIG. 17 is a schematic diagram of the signal waveforms of each node in an application scenario according to the fourth embodiment of the present disclosure.

In the scenario to control the rising speed of the rising edge of the level transition, as shown in FIG. 17, the frequency division r circuit 30 is configured to receive the to-be-detected clock signal CK, perform a two-frequency division for the to-be-detected clock signal CK, and output a two-frequency division clock signal CKDIV2.

The pulse-narrowing circuit 10 is coupled to the output terminal of the frequency division circuit 30 and configured to perform the at least one pulse-narrowing process for the frequency division clock signal to obtain the narrowed output clock signal PSRD. A level pulse width (e.g., 1 us) of the two-frequency division clock signal CKDIV2 depends on the level number of the pulse-narrowing circuit 10 and a parameter of the current-limiting element of each level (e.g., a transistor size, and a capacitor size; the less the discharging speed is, the less a size of a MOS transistor is, and the less the discharging speed is the greater a resistor value is). A goal of the pulse-narrowing circuit 10 is to narrow all pulses of the two-frequency division clock signal CKDIV2 above the detection-point frequency until these pulses disappear.

As shown in FIG. 17, when the frequency of the to-be-detected clock signal CK is less than the detection-point frequency in the pulse-narrowing circuit 10, the narrowed output clock signal PSRD may show a waveform diagram corresponding to a low-frequency portion as shown in FIG. 17.

When the frequency of the to-be-detected clock signal CK is greater than the detection-point frequency in the pulse-narrowing circuit 10, the narrowed output clock signal PSRD may show a waveform diagram corresponding to a high-frequency portion as shown in FIG. 17.

Figure 18:
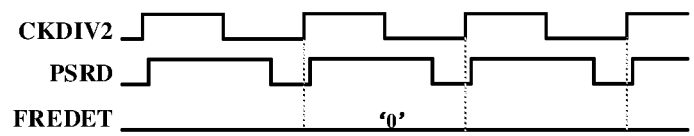
FIG. 18 is a sampling schematic diagram of the judging-and-sampling circuit according to the fourth embodiment of the present disclosure.

As shown in FIG. 18, when the judging-and-sampling circuit 20 samples the waveform diagram corresponding to the low-frequency portion in FIG. 17, the judging-and-sampling circuit 20 continuously samples the narrowed output clock signal PSRD by employing a time point corresponding to a rising edge of the two-frequency division clock signal CKDIV2 and the obtained narrowed output clock signals PSRD are all the logic low levels, the outputted frequency indication signal FREDET is 0. When the frequency indication signal FREDET is 0, it is determined that the frequency of the to-be-detected clock signal CK is in the first frequency range.

Figure 19:
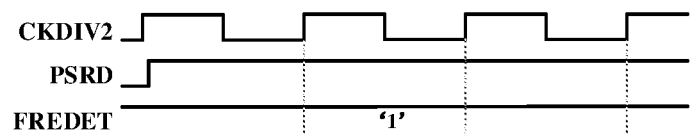
FIG. 19 is another sampling schematic diagram of the judging-and-sampling circuit according to the fourth embodiment of the present disclosure.

As shown in FIG. 19, when the judging-and-sampling circuit 20 samples the waveform diagram corresponding to the high-frequency portion in FIG. 17, the judging-and-sampling circuit 20 continuously samples the narrowed output clock signal PSRD by employing the time point corresponding to the rising edge of the two-frequency division clock signal CKDIV2 and the obtained narrowed output clock signals PSRD are all the logic high levels, the outputted frequency indication signal FREDET is 1. When the frequency indication signal FREDET is 1, it is determined that the frequency of the to-be-detected clock signal CK is in the second frequency range. The first frequency range is less than the second frequency range.

Figure 20:
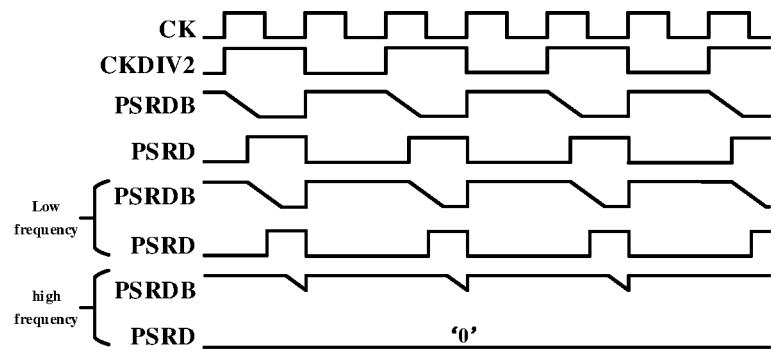
FIG. 20 is a schematic diagram of the signal waveforms of each node in another application scenario according to the fourth embodiment of the present disclosure.

In the scenario to control the falling speed of the falling edge of the level transition, as shown in FIG. 20, the frequency division r circuit 30 is configured to receive the to-be-detected clock signal CK, perform the two-frequency division for the to-be-detected clock signal CK, and output the two-frequency division clock signal CKDIV2.

The pulse-narrowing circuit 10 is coupled to the output terminal of the frequency division circuit 30 and configured to perform the at least one pulse-narrowing process for the frequency division clock signal to obtain the narrowed output clock signal PSRD.

As shown in FIG. 20, when the frequency of the to-be-detected clock signal CK is less than the detection-point frequency in the pulse-narrowing circuit 10, the narrowed output clock signal PSRD may show a waveform diagram corresponding to a low-frequency portion as shown in FIG. 20.

When the frequency of the to-be-detected clock signal CK is greater than the detection-point frequency in the pulse-narrowing circuit 10, the narrowed output clock signal PSRD may show a waveform diagram corresponding to a high-frequency portion as shown in FIG. 20.

Figure 21:
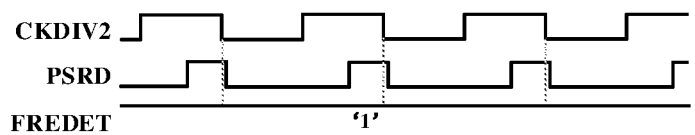
FIG. 21 is another sampling schematic diagram of the judging-and-sampling circuit according to the fourth embodiment of the present disclosure.

As shown in FIG. 21, when the judging-and-sampling circuit 20 samples the waveform diagram corresponding to the low-frequency portion in FIG. 20, the judging-and-sampling circuit 20 continuously samples the narrowed output clock signal PSRD by employing a time point corresponding to a falling edge of the two-frequency division clock signal CKDIV2 and the obtained narrowed output clock signals PSRD are all the logic high levels, the outputted frequency indication signal FREDET is 1. When the frequency indication signal FREDET is 1, it is determined that the frequency of the to-be-detected clock signal CK is less than the detection-point frequency.

Figure 22:
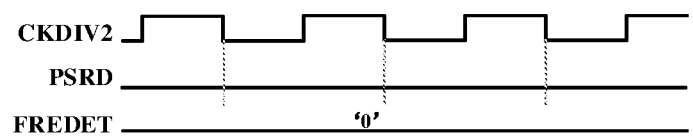
FIG. 22 is another sampling schematic diagram of the judging-and-sampling circuit according to the fourth embodiment of the present disclosure.

As shown in FIG. 22, when the judging-and-sampling circuit 20 samples the waveform diagram corresponding to the high-frequency portion in FIG. 20, the judging-and-sampling circuit 20 continuously samples the narrowed output clock signal PSRD by employing the time point corresponding to the falling edge of the two-frequency division clock signal CKDIV2 and the obtained narrowed output clock signals PSRD are all the logic low levels, the outputted frequency indication signal FREDET is 0. When the frequency indication signal FREDET is 0, it is determined that the frequency of the to-be-detected clock signal CK is greater than the detection-point frequency.

In this embodiment, the frequency division circuit 30 is configured to divide the frequency of the to-be-detected clock signal CK, such that the logic high level and the logic low level in the to-be-detected clock signal CK of which the frequency is divided have the same duration. Thus, the result of the frequency detection may be not influenced by the duty cycle of the to-be-detected clock signal CK. The frequency division circuit is configured to prevent a mistake caused by a duty cycle deviation in response to the duty cycle of the to-be-detected clock signal CK being other than 50%. For example, a width of the logic high level or a width of the logic low level of the clock signal after two-frequency division from the to-be-detected clock signal CK (i.e., CKDIV2) equals to the period of the to-be-detected clock signal CK, respectively. Thus, the duty cycle is certainly 50%. A frequency division by even number is allowed. In some embodiments, the two-frequency division (i.e., frequency-halving) is adopted.

Figure 23:
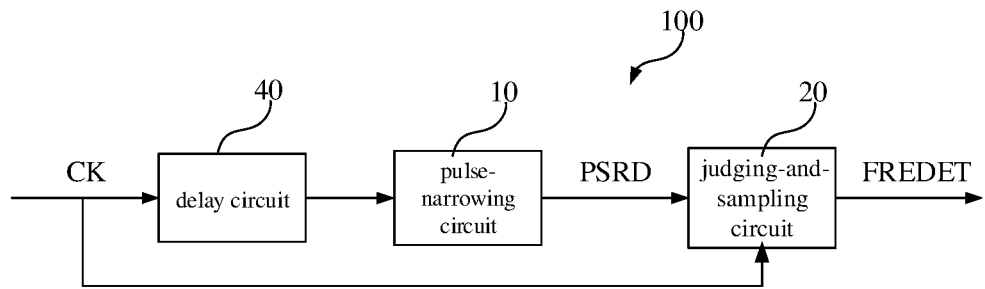
FIG. 23 is a structural schematic view of the frequency-detecting circuit according to a fifth embodiment of the present disclosure.

In some embodiments, in order to ensure that the frequency of the clock signal is smoothly detected, as shown in FIG. 23, the frequency-detecting circuit 100 includes the pulse-narrowing circuit 10, the judging-and-sampling circuit 20, and a delay circuit 40.

The delay circuit 40 is configured to receive the to-be-detected clock signal CK, delay the to-be-detected clock signal CK, and output a delayed to-be-detected clock signal CK. The pulse-narrowing circuit 10 is coupled to an output terminal of the delay circuit and configured to perform the at least one pulse narrowing process for the delayed to-be-detected clock signal CK to obtain the narrowed output clock signal PSRD.

The judging-and-sampling circuit 20 is configured to sample the narrowed output clock signal PSRD by employing the to-be-detected clock signal CK as the sampling clock signal, to obtain the frequency indication signal FREDET. The frequency indication signal FREDET indicates the value range of the frequency of the to-be-detected clock signal CK.

The pulse-narrowing circuit 10 and the judging-and-sampling circuit 20 in this embodiment may be the same with pulse-narrowing circuit 10 and the judging-and-sampling circuit 20 described in any embodiment described above.

In this embodiment, the delay circuit 40 is configured to delay the to-be-detected clock signal CK, such that the narrowed output clock signal PSRD may have the time difference relative to the to-be-detected clock signal CK, and a successful sample may be achieved.

Figure 24:
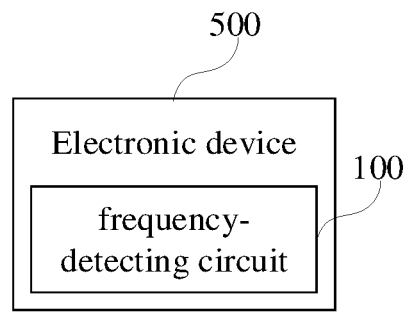
FIG. 24 is a structural schematic view of an electronic device according to an embodiment of the present disclosure.

As shown in FIG. 24, FIG. 24 is a structural schematic view of an electronic device according to an embodiment of the present disclosure. The electronic device 500 includes the frequency-detecting circuit 100 described in any embodiment above. Of course, the electronic device 500 may be a storage apparatus. The storage apparatus may be a Dynamic Random Access Memory (DRAM), such as a Double Data Rate (DDR) Synchronous Dynamic Random-Access Memory (SDRAM).

Figure 25:
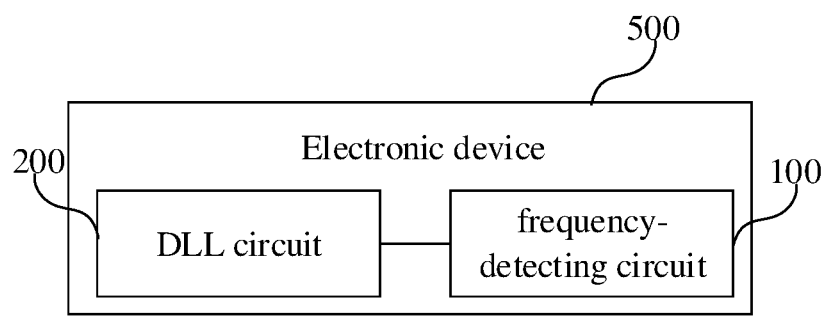
FIG. 25 is a structural schematic view of the electronic device according to another embodiment of the present disclosure.

As shown in FIG. 25, FIG. 25 is a structural schematic view of the electronic device according to another embodiment of the present disclosure. The electronic device 500 includes the frequency-detecting circuit 100 and a Delay-locked Loop (DLL) circuit 200.

The DLL circuit 200 is coupled to the frequency-detecting circuit 100 and configured to adjust a circuit parameter of the DLL circuit 200 based on the frequency indication signal with the to-be-detected clock signal as an input clock. For example, the frequency indication signal FREDET outputted by the frequency-detecting circuit 100 may allow the DLL circuit 200 to adjust the circuit parameter of the DLL circuit 200 in response to the to-be-detected clock signal CK being the low frequency.

For example, since the DLL in the DRAM faces a wide locked frequency range, some characteristic parameters of a DLL system are required to be adjusted according to a variation of an input frequency to improve a performance. For instance, a greater sampling frequency is not suggested to be selected as a loop-locked sampling frequency at the low frequency, otherwise a particularly long DLL locking time may be caused. Thus, the frequency-detecting circuit 100 described above may be selected to generate the frequency indication signal FREDET, to switch the sampling frequency of the DLL.

In some embodiments, the circuit parameter includes the sampling frequency, and the DLL circuit 200 is configured to reduce the sampling frequency in response to the to-be-detected clock signal being less than the detection-point frequency.

In other embodiments, the circuit parameter includes a delay-line delay, and the DLL circuit 200 is configured to increase the delay-line delay in response to the to-be-detected clock signal being less than the detection-point frequency.

For example, the DLL circuit 200 is configured to control an output voltage of a low dropout regulator (LDO) supplying the DLL circuit 200 to be increased or decreased. The delay-line delay varies with the output voltage of the LDO varying. When the frequency of the to-be-detected clock signal CK is the low frequency (e.g. less than the detection-point frequency), the frequency indication signal FREDET controls the output voltage of the LDO to be reduced, and the delay-line delay is in turn increased.

For another example, a MOS capacitor of a delay line node configured to control an on or off of the DLL is controlled. The frequency indication signal FREDET controls a substrate voltage of the MOS capacitor. When the frequency indication signal FREDET is 1, the MOS capacitor is turned off, and the delay-line delay is reduced. When the frequency indication signal FREDET is 0, the MOS capacitor is turned on, and the delay-line delay is increased. In this way, a purpose of changing the delay-line delay is achieved.

When achieved in a form of a soft function unit and is sold or used as a separate product, the embodiments of the present disclosure may be stored in a computer-readable storage medium. Base on such concept, an essential part of the technical solutions of the present disclosure or a part of the technical solutions essentially contributes to the prior art, or a part or a whole of the technical solutions may be embodied in a form of a software product. The computer software product is stored in the storage medium and includes a number of instructions to cause a computer device (e.g., a personal computer, a server, or a network device, etc.) or a processor to perform all or some of the steps of the method described in various embodiments of the present disclosure. The aforementioned storage media include a U disk, a removable hard disk, a ROM, a RAM, a disk, or a CD-ROM, and other media capable of storing program codes.

The scope of the present disclosure is not limited to the above descriptions which are only specific embodiments of the present disclosure. Any equivalent structure or equivalent process transformation using the specification and the accompanying drawings of the present disclosure, or direct or indirect application in other related technical fields, is included in the scope of the present disclosure.

What is claimed is:

1. A frequency-detecting circuit, comprising:
   a pulse-narrowing circuit, configured to receive a to-be-detected clock signal, and perform at least one pulse-narrowing process for the to-be-detected clock signal, wherein the pulse-narrowing circuit has at least one detection-point frequency, and the pulse-narrowing circuit is configured to narrow the to-be-detected clock signal based on the detection-point frequency to obtain a narrowed output clock signal; and
   a judging-and-sampling circuit, coupled to the pulse-narrowing circuit, and configured to sample the narrowed output clock signal by employing the to-be-detected clock signal as a sampling clock signal to obtain a frequency indication signal, wherein the frequency indication signal is configured to indicate whether the to-be-detected clock signal is greater than the detection-point frequency.

2. The frequency-detecting circuit according to claim 1, wherein each of the at least one pulse-narrowing process is configured to perform a first inversion for a current-level input clock signal, control a rising speed of a rising edge of a level transition or a falling speed of a falling edge of the level transition in a process of the first inversion to obtain a first inverted clock signal, and perform a second inversion for the first inverted clock signal to obtain a current-level narrowed output clock signal.

3. The frequency-detecting circuit according to claim 1, wherein
   the to-be-detected clock signal is determined to have a frequency higher than the detection-point frequency, in response to the whole of the frequency indication signal being a first logic signal; or
   the to-be-detected clock signal is determined to have a frequency less than the detection-point frequency, in response to the whole of the frequency indication signal being a second logic signal.

4. The frequency-detecting circuit according to claim 1, wherein the pulse-narrowing circuit comprises M pulse-narrowing units, each of the pulse-narrowing units is coupled to a previous pulse-narrowing unit, and configured to perform one of the at least one pulse narrowing process by employing a previous-level narrowed output clock signal of the previous pulse-narrowing unit as a current-level input clock signal thereof, so as to obtain a current-level narrowed output clock signal; wherein M is a natural number greater than 1; and
   the first one of the M pulse-narrowing units is configured to receive the to-be-detected clock signal, and perform the first one of the at least one pulse narrowing process by employing the to-be-detected clock signal as a first-level input clock signal thereof.

5. The frequency-detecting circuit according to claim 4, wherein the pulse-narrowing circuit is configured to provide N detection-point frequencies to obtain N narrowed output clock signals, wherein a coupling point between any of the pulse-narrowing units and a next-level pulse-narrowing unit thereof, and/or an outputting terminal of the last-level pulse-narrowing unit is able to be an outputting terminal of the pulse-narrowing circuit for outputting a narrowed output clock signal in an individual path, and each narrowed output clock signal in each individual path corresponds to a corresponding detection-point frequency, which is determined by pulse-narrowing units previous to a corresponding outputting terminal of the pulse-narrowing circuit in each individual path;
   wherein the judging-and-sampling circuit comprises N judging-and-sampling units, wherein each of the judging-and-sampling units is coupled to a corresponding one of outputting terminals of the pulse-narrowing circuit, to receive a narrowed output clock signal in a corresponding individual path, and receive the to-be-detected clock signal, so as to obtain a corresponding frequency indication signal in an individual path; wherein N frequency indication signals are configured to indicate a frequency range of the to-be-detected clock signal, and N is a natural number less than or equal to M.

6. The frequency-detecting circuit according to claim 4, wherein each of the pulse-narrowing units comprises:
   a first inversion circuit, being a delayed inversion circuit, and configured to perform a first inversion for a received input clock signal, and control a rising speed of a rising edge of a level transition or a falling speed of a falling edge of the level transition by a current-limiting element in a process of the first inversion, to obtain a first inverted clock signal; and
   a second inversion circuit, being a threshold inversion circuit, and configured to perform a second inversion for the first inverted clock signal to obtain a narrowed output clock signal.

7. The frequency-detecting circuit according to claim 6, wherein in response to controlling the rising speed of the rising edge of the level transition,
   the first inversion circuit comprises:
   a first switching transistor, having a first terminal configured to receive an operating voltage;
   a second switching transistor, having a first terminal coupled to a second terminal of the first switching transistor;
   a third switching transistor, having a first terminal coupled to a second terminal of the second switching transistor, and a second terminal grounded; and
   a capacitor, having a first terminal coupled to the first terminal of the third switching transistor, and a second terminal grounded;
   wherein a control terminal of the first switching transistor, a control terminal of the second switching transistor, and a control terminal of the third switching transistor are configured to receive the to-be-detected clock signal; the third switching transistor is controlled to be turned on to discharge the capacitor in response to the to-be-detected clock signal being a logic high level; and the first switching transistor and the second switching transistor are controlled to be turned on to charge the capacitor in response to the to-be-detected clock signal being a logic low level, and the second switching transistor is served as the current-limiting element and configured to control the rising speed of the rising edge of the level transition so as to obtain the first inverted clock signal; or wherein the first inversion circuit comprises:
a first switching transistor, having a first terminal configured to receive an operating voltage;
a resistor, having a first terminal coupled to a second terminal of the first switching transistor;
a second switching transistor, having a first terminal coupled to a second terminal of the resistor, and a second terminal grounded; and
a capacitor, having a first terminal coupled to the first terminal of the second switching transistor, and a second terminal grounded;
wherein a control terminal of the first switching transistor and a control terminal of the second switching transistor are configured to receive the to-be-detected clock signal; the second switching transistor is controlled to be turned on to discharge the capacitor in response to the to-be-detected clock signal being a logic high level; and the first switching transistor is controlled to be turned on to charge the capacitor in response to the to-be-detected clock signal being a logic low level, and the resistor is served as the current-limiting element and configured to control the rising speed of the rising edge of the level transition so as to obtain the first inverted clock signal; or wherein the first inversion circuit comprises:
a current source;
a first switching transistor, having a first terminal coupled to the current source;
a second switching transistor, having a first terminal coupled to a second terminal of the first switching transistor, and a second terminal grounded; and
a capacitor, having a first terminal coupled to the first terminal of the second switching transistor, and a second terminal grounded;
wherein a control terminal of the first switching transistor and a control terminal of the second switching transistor are configured to receive the to-be-detected clock signal; the second switching transistor is controlled to be turned on to discharge the capacitor in response to the to-be-detected clock signal being a logic high level; and the first switching transistor is controlled to be turned on to charge the capacitor in response to the to-be-detected clock signal being a logic low level, and the current source is served as the current-limiting element and configured to control the rising speed of the rising edge of the level transition so as to obtain the first inverted clock signal.

8. The frequency-detecting circuit according to claim 6, wherein in response to controlling the falling speed of the falling edge of the level transition,
the first inversion circuit comprises:
a first switching transistor, having a first terminal configured to receive an operating voltage;
a second switching transistor, having a first terminal coupled to a second terminal of the first switching transistor;
a third switching transistor, having a first terminal coupled to a second terminal of the second switching transistor, and a second terminal grounded; and
a capacitor, having a first terminal coupled to the first terminal of the second switching transistor, and a second terminal grounded;
wherein a control terminal of the first switching transistor, a control terminal of the second switching transistor, and a control terminal of the third switching transistor are configured to receive the to-be-detected clock signal; the first switching transistor is controlled to be turned on to charge the capacitor in response to the to-be-detected clock signal being a logic low level; and the first switching transistor and the second switching transistor are controlled to be turned on to discharge the capacitor in response to the to-be-detected clock signal being a logic high level, and the second switching transistor is served as the current-limiting element and configured to control the falling speed of the falling edge of the level transition so as to obtain the first inverted clock signal; or wherein the first inversion circuit comprises:
a first switching transistor, having a first terminal configured to receive an operating voltage;
a resistor, having a first terminal coupled to a second terminal of the first switching transistor;
a second switching transistor, having a first terminal coupled to a second terminal of the resistor, and a second terminal grounded; and
a capacitor, having a first terminal coupled to the first terminal of the resistor, and a second terminal grounded;
wherein a control terminal of the first switching transistor and a control terminal of the second switching transistor are configured to receive the to-be-detected clock signal; the first switching transistor is controlled to be turned on to charge the capacitor in response to the to-be-detected clock signal being a logic low level; and the second switching transistor is controlled to be turned on to discharge the capacitor in response to the to-be-detected clock signal being a logic high level, and the resistor is served as the current-limiting element and configured to control the falling speed of the falling edge of the level transition so as to obtain the first inverted clock signal; or wherein the first inversion circuit comprises:
a first switching transistor, having a first terminal configured to receive an operating voltage;
a second switching transistor, having a first terminal coupled to a second terminal of the first switching transistor;
a capacitor, having a first terminal coupled to the first terminal of the second switching transistor; and
a current source, having a first terminal coupled to a second terminal of the capacitor, and a second terminal grounded;
wherein a control terminal of the first switching transistor and a control terminal of the second switching transistor are configured to receive the to-be-detected clock signal; the first switching transistor is controlled to be turned on to charge the capacitor in response to the to-be-detected clock signal being a logic low level; and the second switching transistor is controlled to be turned on to discharge the capacitor in response to the to-be-detected clock signal being a logic high level, and the current source is served as the current-limiting element and configured to control the falling speed of the falling edge of the level transition so as to obtain the first inverted clock signal.

9. The frequency-detecting circuit according to claim 1, further comprising:

a frequency division circuit, configured to receive the to-be-detected clock signal, divide the frequency of the to-be-detected clock signal, and output a frequency division clock signal;

wherein the pulse-narrowing circuit is coupled to an output terminal of the frequency division circuit and configured to perform the at least one pulse-narrowing process for the frequency division clock signal to obtain the narrowed output clock signal.

10. The frequency-detecting circuit according to claim 1, further comprising:

a delay circuit, configured to receive the to-be-detected clock signal, delay the to-be-detected clock signal, and output a delayed to-be-detected clock signal;

wherein the pulse-narrowing circuit is coupled to an output terminal of the delay circuit and configured to perform the at least one pulse narrowing process for the delayed to-be-detected clock signal to obtain the narrowed output clock signal.

11. An electronic device, wherein the electronic device comprises a frequency-detecting circuit comprising:

a pulse-narrowing circuit, configured to receive a to-be-detected clock signal, and perform at least one pulse-narrowing process for the to-be-detected clock signal, wherein the pulse-narrowing circuit has at least one detection-point frequency, and the pulse-narrowing circuit is configured to narrow the to-be-detected clock signal based on the detection-point frequency to obtain a narrowed output clock signal; and a judging-and-sampling circuit, coupled to the pulse-narrowing circuit, and configured to sample the narrowed output clock signal by employing the to-be-detected clock signal as a sampling clock signal to obtain a frequency indication signal, wherein the frequency indication signal is configured to indicate whether the to-be-detected clock signal is greater than the detection-point frequency.

12. The electronic device according to claim 11, further comprising:

a Delay-Locked Loop (DLL) circuit, coupled to the frequency-detecting circuit and configured to adjust a circuit parameter of the DLL circuit based on the frequency indication signal with the to-be-detected clock signal as an input clock.

13. The electronic device according to claim 12, wherein the circuit parameter comprises a sampling frequency, and the DLL circuit is configured to reduce the sampling frequency in response to the to-be-detected clock signal being less than the detection-point frequency.

14. The electronic device according to claim 12, wherein the circuit parameter comprises a delay-line delay, and the DLL circuit is configured to increase the delay-line delay in response to the to-be-detected clock signal being less than the detection-point frequency.

15. The electronic device according to claim 11, wherein each of the at least one pulse-narrowing process is configured to perform a first inversion for a current-level input clock signal, control a rising speed of a rising edge of a level transition or a falling speed of a falling edge of the level transition in a process of the first inversion to obtain a first inverted clock signal, and perform a second inversion for the first inverted clock signal to obtain a current-level narrowed output clock signal.

16. The electronic device according to claim 11, wherein the to-be-detected clock signal is determined to have a frequency higher than the detection-point frequency, in response to the whole of the frequency indication signal being a first logic signal; or the to-be-detected clock signal is determined to have a frequency less than the detection-point frequency, in response to the whole of the frequency indication signal being a second logic signal.

17. The electronic device according to claim 11, wherein the pulse-narrowing circuit comprises M pulse-narrowing units, each of the pulse-narrowing units is coupled to a previous pulse-narrowing unit, and configured to perform one of the at least one pulse narrowing process by employing a previous-level narrowed output clock signal of the previous pulse-narrowing unit as a current-level input clock signal thereof, so as to obtain a current-level narrowed output clock signal; wherein M is a natural number greater than 1; and the first one of the M pulse-narrowing units is configured to receive the to-be-detected clock signal, and perform the first one of the at least one pulse narrowing process by employing the to-be-detected clock signal as a first-level input clock signal thereof.

18. The electronic device according to claim 17, wherein the pulse-narrowing circuit is configured to provide N detection-point frequencies to obtain N narrowed output clock signals, wherein a coupling point between any of the pulse-narrowing units and a next-level pulse-narrowing unit thereof, and/or an outputting terminal of the last-level pulse-narrowing unit is able to be an outputting terminal of the pulse-narrowing circuit for outputting a narrowed output clock signal in an individual path, and each narrowed output clock signal in each individual path corresponds to a corresponding detection-point frequency, which is determined by pulse-narrowing units previous to a corresponding outputting terminal of the pulse-narrowing circuit in each individual path;

wherein the judging-and-sampling circuit comprises N judging-and-sampling units, wherein each of the judging-and-sampling units is coupled to a corresponding one of outputting terminals of the pulse-narrowing circuit, to receive a narrowed output clock signal in a corresponding individual path, and receive the to-be-detected clock signal, so as to obtain a corresponding frequency indication signal in an individual path; wherein N frequency indication signals are configured to indicate a frequency range of the to-be-detected clock signal, and N is a natural number less than or equal to M.

19. The electronic device according to claim 17, wherein each of the pulse-narrowing units comprises:

a first inversion circuit, being a delayed inversion circuit, and configured to perform a first inversion for a received input clock signal, and control a rising speed of a rising edge of a level transition or a falling speed of a falling edge of the level transition by a current-limiting element in a process of the first inversion, to obtain a first inverted clock signal; and a second inversion circuit, being a threshold inversion circuit, and configured to perform a second inversion for the first inverted clock signal to obtain a narrowed output clock signal.

20. The electronic device according to claim 11, wherein the frequency-detecting circuit further comprises:

a frequency division circuit, configured to receive the to-be-detected clock signal, divide the frequency of the to-be-detected clock signal, and output a frequency division clock signal;

wherein the pulse-narrowing circuit is coupled to an output terminal of the frequency division circuit and configured to perform the at least one pulse-narrowing process for the frequency division clock signal to obtain the narrowed output clock signal.

* * * * *